(12) United States Patent
Yamamoto

(10) Patent No.: US 11,370,621 B2
(45) Date of Patent: Jun. 28, 2022

(54) CONVEYANCE APPARATUS AND MANUFACTURING METHOD OF ARTICLE

(71) Applicant: CANON KABUSHIKI KAISHA, Tokyo (JP)

(72) Inventor: Takeshi Yamamoto, Kanagawa (JP)

(73) Assignee: Canon Kabushiki Kaisha, Tokyo (JP)

(\*) Notice: Subject to any disclaimer, the term of this patent is extended or adjusted under 35 U.S.C. 154(b) by 0 days.

(21) Appl. No.: 17/119,829

(22) Filed: Dec. 11, 2020

(65) Prior Publication Data
US 2021/0188569 A1 Jun. 24, 2021

(30) Foreign Application Priority Data
Dec. 24, 2019 (JP) .............................. JP2019-233231

(51) Int. Cl.
| | |
|---|---|
| *B65G 54/02* | (2006.01) |
| *B65G 49/06* | (2006.01) |
| *H01L 21/677* | (2006.01) |
| *B65G 54/00* | (2006.01) |
| *H02K 41/03* | (2006.01) |

(52) U.S. Cl.
CPC .............. *B65G 54/02* (2013.01); *B65G 49/06* (2013.01); *B65G 54/00* (2013.01); *H01L 21/677* (2013.01); *H02K 41/03* (2013.01)

(58) Field of Classification Search
CPC ......... B60L 13/04; B65G 49/06; B65G 54/00; B65G 54/02; F16C 32/04; H01L 21/677; H02K 41/03

USPC ........................................................ 198/805
See application file for complete search history.

(56) References Cited

U.S. PATENT DOCUMENTS

| | | | | |
|---|---|---|---|---|
| 5,947,361 | A  * | 9/1999 | Berger | B65G 54/02 |
| | | | | 226/92 |
| 8,210,343 | B2 * | 7/2012 | Lykkegaard | H02K 41/031 |
| | | | | 198/805 |
| 2003/0005851 | A1* | 1/2003 | Post | B60L 13/04 |
| | | | | 104/281 |
| 2012/0090963 | A1* | 4/2012 | van de Loecht | B65G 54/02 |
| | | | | 198/805 |
| 2020/0052568 | A1* | 2/2020 | Yamamoto | H02K 11/21 |

FOREIGN PATENT DOCUMENTS

| | | | | |
|---|---|---|---|---|
| JP | 2016-532308 A | | 10/2016 | |
| KR | 20130138387 A | * | 12/2013 | ............ B65G 54/02 |
| WO | 2015/056847 A1 | * | 4/2015 | ............ B65G 54/00 |

\* cited by examiner

*Primary Examiner* — James R Bidwell
(74) *Attorney, Agent, or Firm* — Canon U.S.A., Inc. I.P. Division

(57) ABSTRACT

A conveyance apparatus includes a stator in which a plurality of coils is arranged along a first direction and a movable element to move along the plurality of coils. The stator includes a first magnet group including a plurality of first magnets arranged along the first direction and magnetized in one direction. The movable element includes a second magnet group including a plurality of second magnets arranged to face the plurality of coils, and a third magnet group including a plurality of third magnets arranged to face the first magnet group and magnetized in a direction repelling the first magnet group.

17 Claims, 19 Drawing Sheets

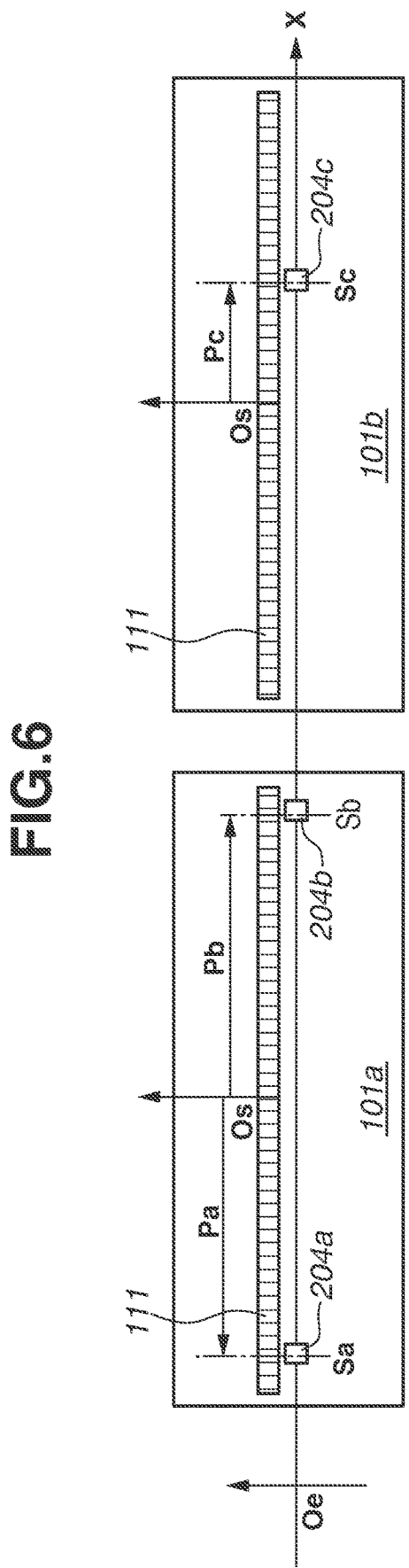

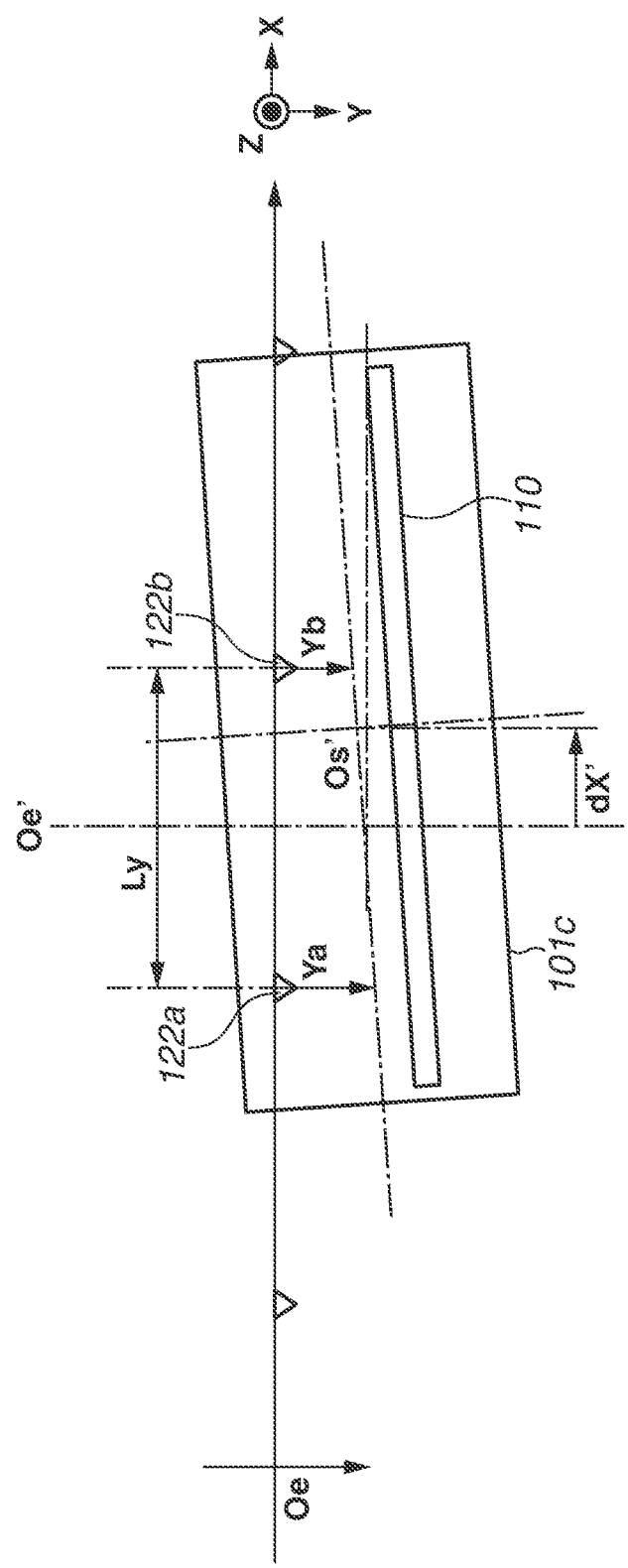

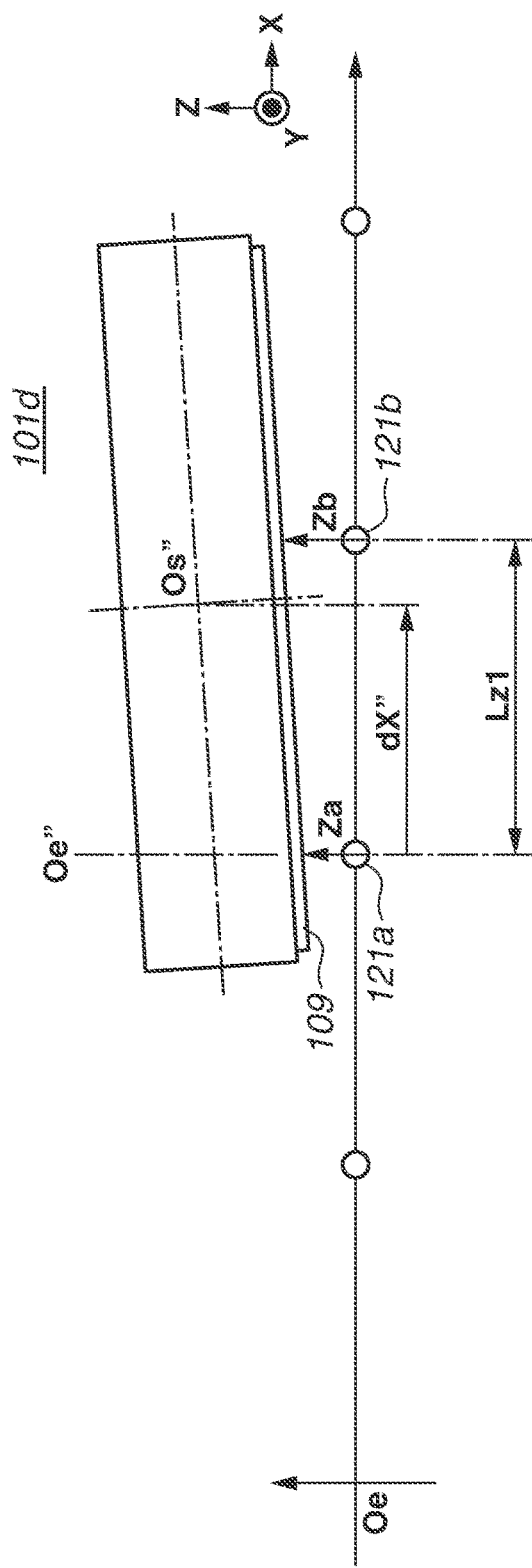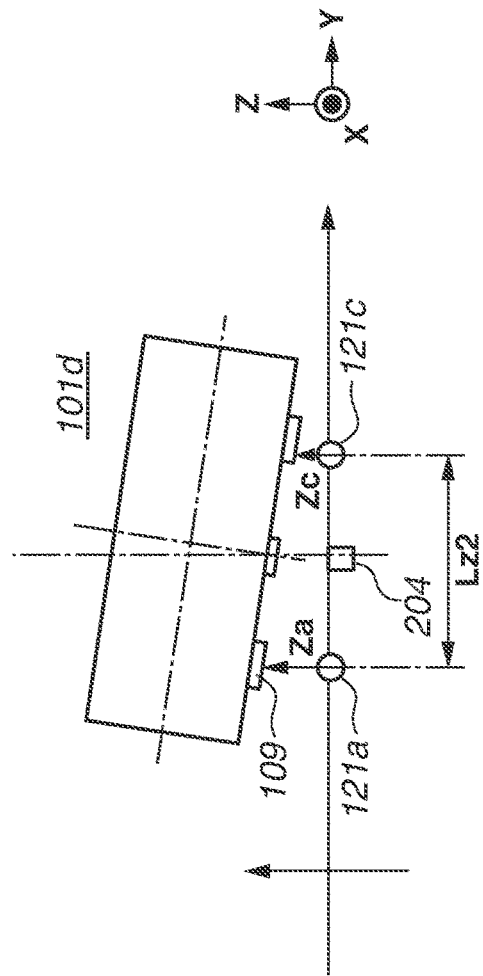

US 11,370,621 B2

CONVEYANCE APPARATUS AND MANUFACTURING METHOD OF ARTICLE

BACKGROUND

Field

The present disclosure relates to a conveyance apparatus and a manufacturing method of an article.

Description of the Related Art

Conveyance apparatuses are generally used in a production line for assembling industrial products or a semiconductor exposure apparatus. In particular, a conveyance apparatus in a production line conveys workpieces such as components within a factory-automated production line or between a plurality of stations between production lines. In some cases, a conveyance apparatus is used in a process apparatus. As the conveyance apparatus, a conveyance apparatus in which a moving-magnet type linear motor is employed has already been proposed.

The conveyance apparatus with a moving-magnet type linear motor includes a guide apparatus, such as a linear guide, that involves mechanical contact. In such a conveyance apparatus in which the guide apparatus, such as a linear guide, is employed, there has been an issue of deterioration in productivity that is caused by contaminated materials generated at a slide unit of the linear guide, such as a wear fragment from a rail or a bearing, lubricant oil, or volatilized lubricant oil, for example. In addition, friction of the slide unit becomes large during the high-speed conveyance, and this shortens the operating life of the linear guide.

In addressing conveyance apparatuses, Japanese Patent Laid-Open No. 2016-532308 discusses a magnetic levitation conveyance apparatus that can convey a conveyance tray in a contactless manner. The magnetic levitation conveyance apparatus as discussed in Japanese Patent Laid-Open No. 2016-532308 implements contactless conveyance by using electrical magnets for levitation arranged in an upper part of a chamber and stator coils on the side surface of the chamber at regular intervals along the conveyance direction of the conveyance tray.

Nevertheless, a demand for more stable conveyance of a movable element has yet to be resolved.

SUMMARY

According to an aspect of the present disclosure, a conveyance apparatus includes a stator in which a plurality of coils is arranged along a first direction, and a movable element configured to move along the plurality of coils, wherein the stator includes a first magnet group including a plurality of first magnets arranged along the first direction and magnetized in one direction, and wherein the movable element includes a second magnet group including a plurality of second magnets arranged to face the plurality of coils, and a third magnet group including a plurality of third magnets arranged to face the first magnet group and magnetized in a direction repelling the first magnet group.

Further features of the present disclosure will become apparent from the following description of exemplary embodiments with reference to the attached drawings.

BRIEF DESCRIPTION OF THE DRAWINGS

FIG. 6 is a schematic diagram illustrating the first exemplary embodiment of the present disclosure.

FIG. 7 is a schematic diagram illustrating the first exemplary embodiment of the present disclosure.

FIG. 8A is a schematic diagram illustrating the first exemplary embodiment of the present disclosure.

FIG. 8B is a schematic diagram illustrating the first exemplary embodiment of the present disclosure.

DESCRIPTION OF THE EMBODIMENTS

First Exemplary Embodiment

Hereinafter, a first exemplary embodiment of the present disclosure will be described with reference to FIGS. 1 to 9C.

First of all, the overall configuration of a conveyance apparatus 1 according to the present exemplary embodiment will be described with reference to FIG. 1.

Figure 1:
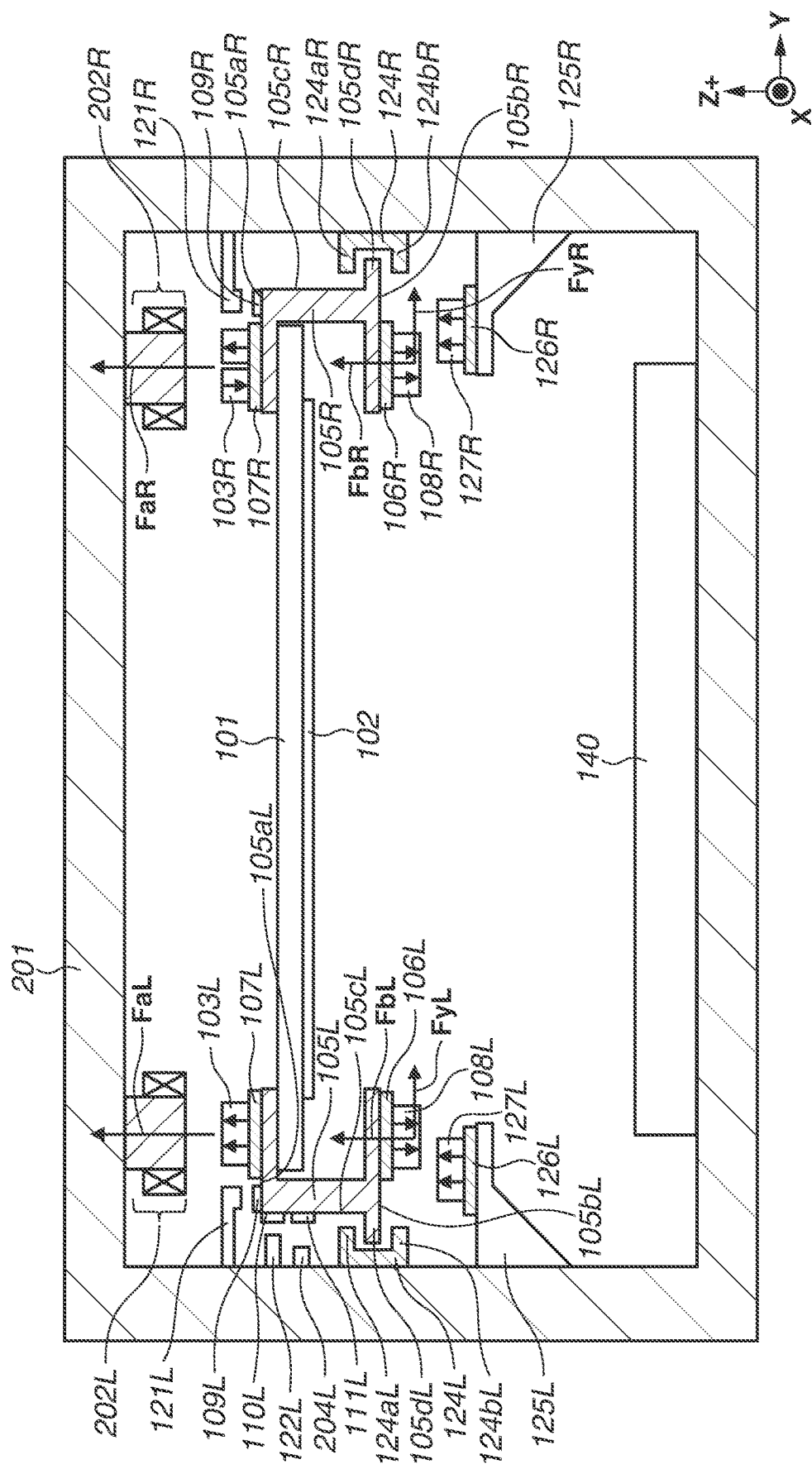
FIG. 1 is a schematic diagram illustrating a first exemplary embodiment of the present disclosure.

FIG. 1 is a schematic diagram illustrating the overall configuration of the conveyance apparatus 1 including a movable element 101 and a stator 201 according to the present exemplary embodiment.

As illustrated in FIG. 1, the conveyance apparatus 1 according to the present exemplary embodiment includes the movable element 101 including a trolley, a slider, or a carriage, and the stator 201 forming a conveyance path. The conveyance apparatus 1 is formed as a magnetic levitation type conveyance apparatus that conveys the movable element 101 in a contactless manner with respect to the stator 201. In the present exemplary embodiment, a conveyance apparatus in which a moving-magnet type linear motor (moving-permanent-magnet type linear motor, moving-field-magnet type linear motor) is employed is illustrated as an example of the conveyance apparatus 1, but the conveyance apparatus 1 may be a conveyance apparatus with a moving coil.

For example, by conveying the movable element 101 relatively with respect to the stator 201, the conveyance apparatus 1 conveys a workpiece 102 to be moved together with the movable element 101 to a processing apparatus that performs a processing work. Then, the conveyance apparatus 1 performs a processing work on the workpiece 102, and an article is then manufactured. In the present exemplary embodiment, a deposition apparatus is illustrated as an example of the processing apparatus. In FIG. 1, the deposition apparatus includes a deposition source 140, and the stator 201 forms a chamber. In other words, the deposition apparatus is provided with the conveyance apparatus 1 that relatively conveys the workpiece 102 with respect to the deposition source together with the movable element 101. FIG. 1 illustrates one movable element 101 to be conveyed with respect to the stator 201, but the number of movable elements 101 is not limited to this. In the conveyance apparatus 1, a plurality of movable elements 101 can be relatively conveyed with respect to the stator 201.

Coordinate axes and directions to be used in the following description will now be defined. First of all, an X-axis is extended along a horizontal direction that is a conveyance direction of the movable element 101, and the conveyance direction of the movable element 101 is set as an X direction. In addition, a Z-axis is extended along a vertical direction that is a direction orthogonal to the X direction, and the vertical direction is set as a Z direction. In addition, a Y-axis is extended along a direction orthogonal to the X direction and the Z direction, and the direction orthogonal to the X direction and the Z direction is set as a Y direction. Furthermore, rotation around the X-axis is denoted by "Wx", rotation around the Y-axis is denoted by "Wy", and rotation around the Z-axis is denoted by "Wz". In addition, an asterisk ("*") is used as a symbol of multiplication. In addition, the center of the movable element 101 is set as an origin O, and a Y+ side is described as an R side and a Y− side is described as an L side. The conveyance direction of the movable element 101 is not necessarily set to the horizontal direction. Even in a case where the conveyance direction is set to a direction other than the horizontal direction, the conveyance direction can be set as the X direction as well, and the Y direction and the Z direction can be similarly defined based on the X direction.

Next, the movable element 101 to be conveyed by the conveyance apparatus 1 according to the present exemplary embodiment will be described with reference to FIGS. 1, 2A, and 2B.

FIG. 1 is a diagram illustrating the movable element 101 and the stator 201 that are viewed from the X direction. The left half in FIG. 1 illustrates a cross section taken along a (B)-(B) line in FIG. 2A. In addition, the right half in FIG. 1 illustrates a cross section taken along an (A)-(A) line in FIG. 2A.

Permanent magnets 103L and 103R are arranged and attached to the respective end portions on the L side and the R side of the top surface of the movable element 101 that extends in the X direction. Specifically, permanent magnets 103aR, 103bR, 103cR, and 103dR are attached to the R side of the top surface of the movable element 101. In addition, permanent magnets 103aL, 103bL, 103cL, and 103dL are attached to the L side of the top surface of the movable element 101. In the following description, unless otherwise a specific distinction between the foregoing permanent magnets is required, the permanent magnets on the top surface of the movable element 101 will be described as the "permanent magnets 103". In addition, when it is necessary to identify each individual permanent magnet 103 while there is no need to make a distinction between the R side and the L side, each permanent magnet 103 is individually identified using a reference numeral with the lower-case alphabet appended thereafter as an identifier and without the letter "R" or "L" at the end of the reference numeral indicating a corresponding permanent magnet 103. In this case, each permanent magnet 103 is individually identified by describing a corresponding permanent magnet 103 as a "permanent magnet 103a", a "permanent magnet 103b", a "permanent magnet 103c" or a "permanent magnet 103d".

The permanent magnets 103aR and 103dR are respectively attached to one end portion and the other end portion in the X direction on the R side of the top surface of the movable element 101 that extends in the X direction. The permanent magnets 103bR and 103cR are attached between the permanent magnets 103aR and 103dR on the R side of the top surface of the movable element 101. The permanent magnets 103aR, 103bR, 103cR, and 103dR are arranged at equal intervals in the X direction, for example. In addition, the permanent magnets 103aR, 103bR, 103cR, and 103dR are arranged in such a manner that their respective centers are aligned on a straight line extending along the X direction at a predetermined distance rx3 rightward from the center of the top surface of the movable element 101, for example.

The permanent magnets 103aL and 103dL are respectively attached to one end portion and the other end portion in the X direction on the L side of the top surface of the movable element 101 that extends in the X direction. The permanent magnets 103bL and 103cL are attached between the permanent magnets 103aL and 103dL on the L side of the top surface of the movable element 101. The permanent magnets 103aL, 103bL, 103cL, and 103dL are arranged at equal intervals in the X direction, for example. In addition, the permanent magnets 103aL, 103bL, 103cL, and 103dL are arranged in such a manner that their respective centers are aligned on a straight line extending along the X direction at the predetermined distance rx3 leftward from the center of the top surface of the movable element 101, for example. Furthermore, the permanent magnets 103aL, 103bL, 103cL, and 103dL are arranged at the same respective positions as the permanent magnets 103aR, 103bR, 103cR, and 103dR in the X direction.

The permanent magnets 103a and 103d are attached to the respective positions at a distance rz3 toward one end and the other end in the X direction from the origin O being the center of the movable element 101. The permanent magnets 103a, 103b, 103c, and 103d are attached to the respective positions at the distance rx3 from the origin O in the Y direction. The permanent magnets 103c and 103b are attached to the respective positions at a distance ry3 from the origin O toward one end and the other end in the X direction.

Each of the permanent magnets 103aR, 103dR, 103aL, and 103dL is a set of two permanent magnets arranged in the Y direction. The permanent magnets 103a and 103d each include two permanent magnets arranged in the Y direction in such a manner that polarities of outer magnetic poles facing the stator 201 side alternately vary. The number of permanent magnets that are arranged in the Y direction in each of the permanent magnets 103a and 103d is not limited to two. The number of permanent magnets is only required to be plural. In addition, the direction in which permanent magnets included in each of the permanent magnets 103a and 103d are arranged needs not be the Y direction orthogonal to the X direction being the conveyance direction, and is only required to be a direction intersecting with the X direction. In other words, each of the permanent magnets 103a and 103d is only required to be a magnet group including a plurality of permanent magnets arranged in a direction intersecting with the X direction in such a manner that the polarities of the respective magnetic poles become alternate.

On the other hand, each of the permanent magnets 103bR, 103cR, 103bL, and 103cL is a set of three permanent magnets arranged in the X direction. The permanent magnets 103b and 103c each include three permanent magnets arranged in the X direction in such a manner that polarities of outer magnetic poles facing the stator 201 side alternately vary. The number of permanent magnets that are arranged in the X direction in each of the permanent magnets 103b and 103c is not limited to three, and is only required to be plural. In other words, each of the permanent magnets 103b and 103c is only required to be a magnet group including a plurality of permanent magnets arranged in the X direction in such a manner that the polarities of the respective magnetic poles are alternately different.

The permanent magnets 103 are attached to yokes 107 provided on the R side and the L side of the top surface of the movable element 101. The yokes 107 is made of a material with high magnetic permeability, such as iron.

In such a manner, a plurality of permanent magnets 103 is arranged on the R side and the L side of the top surface of the movable element 101 symmetrically about a symmetrical axis corresponding to the central axis of the movable element 101 that extends in the X-axis. As described below, the movable element 101 on which the permanent magnets 103 are arranged is configured to be movable while the orientation is controlled along six axes by a force (electromagnetic force) received by the permanent magnets 103 when a current is applied to a plurality of coils 202 of the stator 201. In addition, the permanent magnets 103 will be also referred to as a second magnet group. The plurality of permanent magnets 103a, 103b, 103c, and 103d included in the second magnet group will be also referred to as second magnets. The second magnet is not limited to a permanent magnet, and may be an electromagnet.

In addition, permanent magnets 108 are arranged in two rows at the end portions on the L side and the R side of the bottom surface of the movable element 101 in the X direction. Specifically, the permanent magnet 108R is attached to the R side of the bottom surface of the movable element 101. In addition, the permanent magnet 108L is attached to the L side of the bottom surface of the movable element 101. In the following description, unless otherwise a specific distinction between the permanent magnets is required, the permanent magnets on the bottom surface of the movable element 101 will be described as "permanent magnets 108".

The respective permanent magnets 108 are attached to yokes 106R and 106L provided on the R side and the L side of the bottom surface of the movable element 101. The yokes 106R and 106L are made of a material with high magnetic permeability, such as iron.

Even in a case where control is not performed using an electromagnetic force such as a case where power is turned OFF, the position of the movable element 101 can be maintained by a repulsive force generated between the permanent magnets 108 and permanent magnets 127 provided on the stator 201, which will be described below. In other words, forces repelling in a direction parallel to a direction of a gravitational force can be generated between the permanent magnets 108 and the permanent magnets 127 provided on the stator 201. More specifically, forces repelling each other can be generated by magnetizing the plurality of permanent magnets 127 in one direction, and magnetizing the plurality of permanent magnets 108 facing the plurality of permanent magnets 127, in a direction repelling the plurality of permanent magnets 127 magnetized in the one direction. In addition, the permanent magnets 108 will be also referred to as a third magnet group. The plurality of permanent magnets 108R and 108L included in the third magnet group will be also referred to as third magnets. The third magnet is not limited to a permanent magnet, and may be an electrical magnet.

The movable element 101 is conveyed in a state in which the workpiece 102 to be conveyed is placed on or attached to the top surface or the bottom surface thereof. The movable element 101 may include a holding mechanism such as a workpiece holder that holds the workpiece 102 on the movable element 101.

In addition, the movable element 101 may be attached to movable element adapters 105 (105L and 105R). In this case, the permanent magnets 103L and 108L are attached to the movable element adapter 105L and the permanent magnets 103R and 108R are attached to the movable element adapter 105R.

In a case of the movable element 101 including the movable element adapters 105, if the movable element 101 is attachable to the movable element adapters 105 even though its shape is changed, the movable element 101 can be conveyed without changing the design of the movable element 101. In this specification, the movable element 101 may include a holding mechanism, or may include the movable element adapters 105.

The movable element adapters 105L and 105R respectively have top surfaces (105aL and 105aR), bottom surfaces (105bL and 105bR), and side surfaces (105cL and 105cR). In the present exemplary embodiment, the side surfaces (105cL and 105cR) respectively have protruding portions (105dL and 105dR) protruding from the side surfaces (105cL and 105cR). In addition, the protruding portion 105d projects between an upper projecting portion 124a and a lower projecting portion 124b of a stopper 124 attached to the stator 201. With this configuration, even if a levitation state of the movable element 101 changes, a movable range thereof (between the upper projecting portion 124a and the lower projecting portion 124b) can be restricted by the stopper 124.

Next, the stator 201 of the conveyance apparatus 1 according to the present exemplary embodiment will be described with reference to FIGS. 1, 3, and 10.

Figure 3:
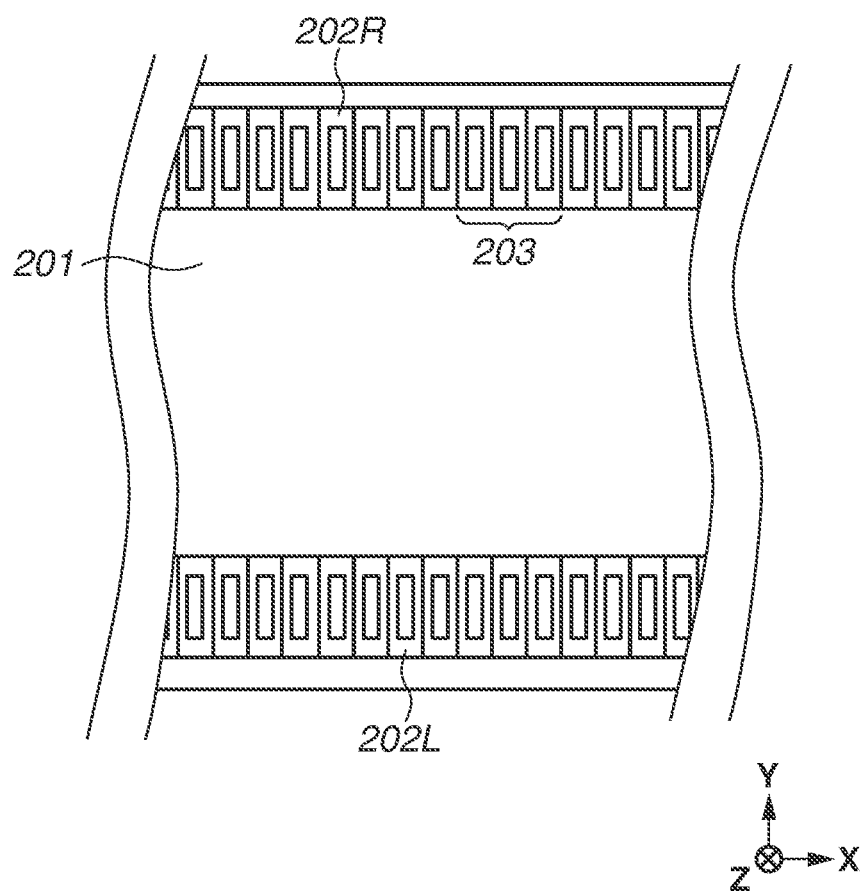
FIG. 3 is a schematic diagram illustrating the first exemplary embodiment of the present disclosure.

FIG. 3 is a schematic diagram illustrating the coils 202 of the stator 201. FIG. 3 is a diagram illustrating the coils 202 viewed upward from the below in the Z direction.

FIG. 3 illustrates an example of the stator 201 in which the plurality of coils 202 is arranged along the X direction being the conveyance direction of the movable element 101. The plurality of coils 202 is attached to the stator 201 to face the permanent magnets 103L and 103R arranged on the L side and the R side of the top surface of the movable element 101. Coils 202L are arranged to face the permanent magnet 103L on the L side, and coils 202R are arranged to face the permanent magnet 103R on the R side. In the following description, unless otherwise a specific distinction between the coils is required, the coils will be described as "coils 202". The stator 201 forms a conveyance path of the movable element 101 by extending in the X direction being the conveyance direction.

As illustrated in FIG. 1, the movable element 101 conveyed along the stator 201 includes, on the L side, a linear scale 111L, a Y target 110L, and a Z target 109L. In a similar manner, the movable element 101 includes a Z target 109R on the R side. In the following description, unless otherwise a specific distinction is required, the linear scale will be described as a linear scale 111, a Y target will be described as a Y target 110, and a Z target will be described as a Z target 109. The linear scale 111, the Y target 110, and the Z target 109 are attached to the side surface of the movable element 101 along the X direction, for example. In this specification, the Y target is a projection to be detected by a Y sensor. By detecting a distance between the Y sensor and the Y target, a position in the Y direction can be obtained. In a similar manner, the Z target is a projection to be detected by a Z sensor. By detecting a distance between the Z sensor and the Z target, a position in the Z direction can be obtained.

As illustrated in FIG. 1, the stator 201 includes, on the L side, a plurality of coils 202L, a plurality of linear encoders 204L, a plurality of Y sensors 122L, and a plurality of Z sensors 121L. In a similar manner, the stator 201 includes, on the R side, a plurality of coils 202R and a plurality of Z sensors 121R. In the following description, unless otherwise a specific distinction is required between the coils, the coils will be described as coils 202, the linear encoders will be described as linear encoders 204, the Y sensors will be described as Y sensors 122, and the Z sensors will be described as Z sensors 121.

The plurality of coils 202 is arranged in two rows along the X direction and attached to the stator 201 to face the permanent magnets 103 on the R side and the L side of the top surface of the movable element 101. The plurality of coils 202R is arranged in a row on the R side along the X direction to face the permanent magnets 103aR, 103bR, 103cR, and 103dR on the R side of the movable element 101. In addition, surfaces of the plurality of coils 202L arranged in a row on the L side that face the movable element 101 are arranged along the X direction to face the permanent magnets 103aL, 103bL, 103cL, and 103dL on the L side of the movable element 101.

In the present exemplary embodiment, rows of the coils 202 on the R side and the L side of the movable element 101 are arranged to face the permanent magnets 103a and 103d, and the permanent magnets 103b and 103c that are different in the arrangement direction of a plurality of included permanent magnets. Thus, as described below, forces can be applied to the movable element 101 in the conveyance direction and in a direction different from the conveyance direction using a smaller number of rows of the coils 202, and can accordingly implement the conveyance control and orientation control of the movable element 101.

In this manner, the plurality of coils 202 is attached along a direction in which the movable element 101 is conveyed. The plurality of coils 202 is arranged in the X direction at predetermined intervals. In addition, each of the coils 202 is attached in such a manner that its central axis faces the Z direction. The coil 202 refers to a coil winded around a core. In the present exemplary embodiment, the position of a coil indicates the position of a core.

The current in the plurality of coils 202 is controlled in a unit of three coils, for example. The unit of the coils 202 to be subjected to power supply control will be described as a "coil unit 203". By being supplied with power, the coils 202 can apply a force to the movable element 101 by generating an electromagnetic force between the coils 202 and the permanent magnets 103 of the movable element 101.

In FIGS. 1 to 3, the permanent magnets 103a and 103d each include a magnet group in which two permanent magnets are arranged in the Y direction. On the other hand, the coils 202 are arranged in such a manner that the center in the Y direction of two permanent magnets of each of the permanent magnets 103a and 103d corresponds to the center in the Y direction of the coils 202. By supplying power to the coils 202 facing the permanent magnets 103a and 103d, a force acting in the Y direction is generated in the permanent magnets 103a and 103d.

In addition, the permanent magnets 103b and 103c each include a magnet group in which three permanent magnets are arranged in the X direction. By supplying power to the coils 202 facing the permanent magnets 103b and 103c, a force acting in the X direction and the Z direction is generated in the permanent magnets 103b and 103c.

The plurality of linear encoders 204 is attached to the stator 201 along the X direction to face the respective linear scales 111 of the movable element 101. Each of the linear encoders 204 can detect and output a relative position with respect to the linear encoder 204 of the movable element 101 by reading the linear scale 111 attached to the movable element 101.

The plurality of Y sensors 122 is attached to the stator 201 along the X direction to face the respective Y targets 110 of the movable element 101. Each of the Y sensors 122 can detect and output a relative distance in the Y direction between the Y sensor 122 and the Y target 110 attached to the movable element 101.

The plurality of Z sensors 121 is attached to the stator 201 in two rows along the X direction to face the respective Z targets 109 of the movable element 101. Each of the Z sensors 121 can detect and output a relative distance in the Z direction between the Z sensor 121 and the Z target 109 attached to the movable element 101.

Figure 10:
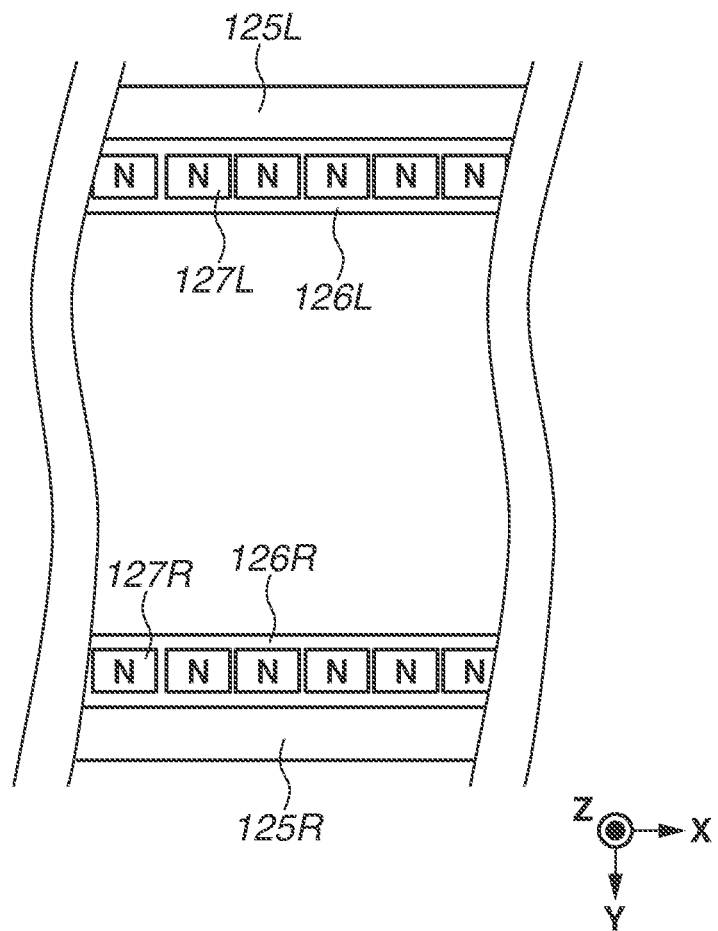
FIG. 10 is a schematic diagram illustrating the first exemplary embodiment of the present disclosure.

FIG. 10 is a schematic diagram illustrating the permanent magnets 127L and 127R of the stator 201. FIG. 10 is a diagram illustrating the permanent magnets 127L and 127R viewed downward from above in the Z direction.

The plurality of permanent magnets 127 is attached to the stator 201 illustrated in FIG. 10 to face the permanent magnets 108L and 108R arranged on the L side and the R side of the bottom surface of the movable element 101. A permanent magnet 127L is arranged to face the permanent magnet 108L on the L side, and a permanent magnet 127R is arranged to face the permanent magnet 108R on the R side. The permanent magnet 127L may be attached to a yoke 126L provided on the stator 201. The permanent magnet 127R may be attached to a yoke 126R provided on the stator 201. The yokes 126 are made of a material with high magnetic permeability, such as iron. The permanent magnet 127L may be attached to the stator 201 via a bracket 125L, and the permanent magnet 127R may be attached to the stator 201 via a bracket 125R.

In the following description, unless otherwise a specific distinction is required between the permanent magnets, the permanent magnets will be also described as "permanent magnets 127".

In FIG. 1, arrows in the permanent magnets 108L and 108R and the permanent magnets 127L and 127R each indicate a magnetization direction of a corresponding permanent magnet. For example, the tip of an arrow indicates a north pole and the root of an arrow indicates a south pole. As illustrated in FIG. 1, the magnetization directions of the permanent magnet 108L and the permanent magnet 127L are opposite directions in the Z direction. Accordingly, if the permanent magnet 108L and the permanent magnet 127L get close to each other, forces increase in directions repelling each other. In a similar manner, the magnetization directions of the permanent magnet 108R and the permanent magnet 127R are opposite directions in the Z direction. Accordingly, if the permanent magnet 108R and the permanent magnet 127R get close to each other, forces increase in directions repelling each other. In addition, the permanent magnets 127 will be also referred to as a first magnet group. The plurality of permanent magnets 127R and 127L included in the first magnet group will be also referred to as first magnets. The first magnet is not limited to a permanent magnet, and may be an electrical magnet.

The permanent magnet 127L is attached to the stator 201 at a position that faces the permanent magnet 108L and is distant from the movable range in the Z direction that is restricted by the stopper 124. In a similar manner, the permanent magnet 127R is attached to the stator 201 at a position that faces the permanent magnet 108R and is distant from the movable range restricted by the stopper 124.

Furthermore, the permanent magnet 108L and the permanent magnet 127L, and the permanent magnet 108R and the permanent magnet 127R are arranged in such a manner that their center positions are preliminarily shifted in the Y direction. In FIG. 1, the permanent magnet 127L is arranged on the outer side relative to the permanent magnet 108L. In a similar manner, the permanent magnet 127R is arranged on the outer side relative to the permanent magnet 108R. By arranging the permanent magnets in this manner, as described below, even in a state in which power is not supplied to the coils 202 around a position in the Y direction at which potential energy becomes the minimum, the position of the movable element 101 can be maintained at a stable position in the Y direction.

The state of the movable element 101 and the stator 201 will be described with reference to FIG. 15.

Figure 15:
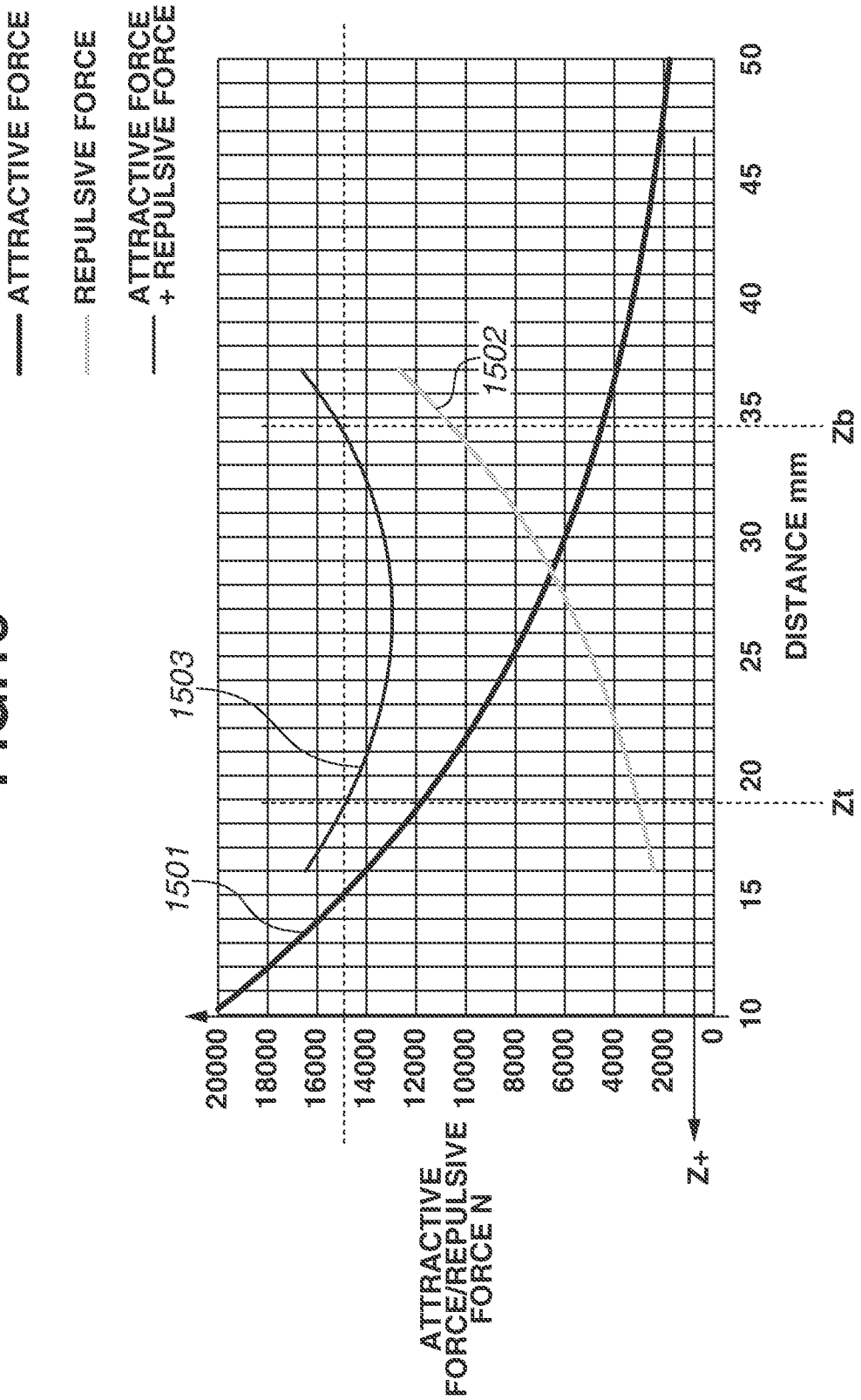
FIG. 15 is a diagram illustrating states of a stator and a movable element.

FIG. 15 illustrates an example of an experiment result of the magnitude of a force acting between permanent magnets.

On a graph illustrated in FIG. 15, positions in the Z direction are plotted in a horizontal axis, and the magnitudes of forces acting in the Z direction are plotted in a vertical axis.

An attractive force 1501 acts between the coils 202 and the permanent magnets 103, and a repulsive force 1502 acts between the permanent magnets 108 and the permanent magnets 127. Both the attractive force 1501 and the repulsive force 1502 act upward. For example, if the weight of the movable element 101 is 1500 kg, when a total force 1503 is 15000 N, forces balance out near Z=Zt and Z=Zb.

Especially near Z=Zb, if Z becomes smaller than Zb, the total force 1503 becomes larger than a gravitational force received by the movable element 101, acceleration is generated in an upper direction. In contrast, if Z becomes larger than Zb, because the total force 1503 becomes smaller than a gravitational force received by the movable element 101, acceleration is generated in a lower direction. Thus, near Z=Zb, the position of the movable element 101 becomes stable.

Based on the experiment result, it has been identified that the inclination of the graph of the attractive force 1501 becomes larger as a position in the Z direction moves towards a Z+ direction. It also has been identified that, in contrast, the inclination of the graph of the repulsive force 1502 between permanent magnets becomes larger as a position in the Z direction moves towards a Z− direction.

From these findings, it can be seen that, by appropriately selecting the positions and sizes of the coils 202 and the permanent magnets 103 facing the coils 202, and the permanent magnets 108 and the permanent magnets 127 facing the permanent magnets 108, even in a state in which power is not supplied to the coils 202, the positions thereof can be stabilized.

The above point will be described in detail with reference to FIG. 11A based on the concept of potential energy.

Figure 11A:
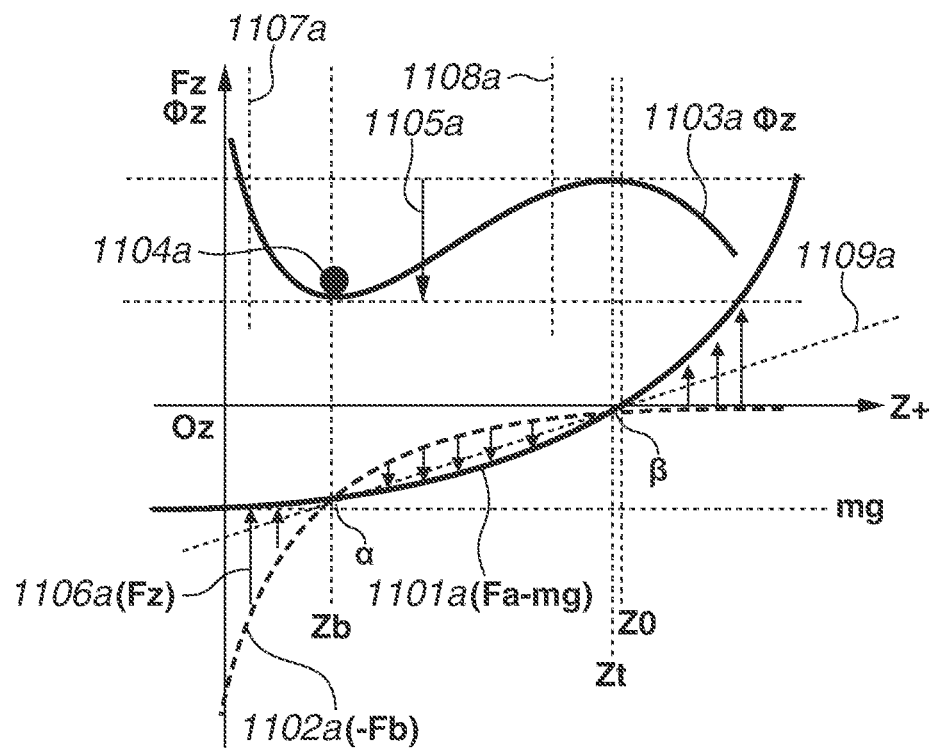
FIG. 11A is a schematic diagram illustrating the first exemplary embodiment of the present disclosure.

FIG. 11A is a diagram schematically illustrating the magnitude of a force received by the movable element 101.

In FIG. 11A, a horizontal axis indicates a position in the Z+ direction, and a vertical axis indicates magnitude Fz of a force in the Z direction that is received by the movable element 101, and potential energy $\Phi Z$ of the movable element 101.

Hereinafter, a force received in a state in which power is not supplied to the coils 202 will be described.

The magnitude (Fz) of a force received by the movable element 101 includes a force (Fa) by which the permanent magnets 103 are attracted to the coils 202, a force (Fb) by which the permanent magnets 108 are pushed up by the permanent magnets 127, and a gravitational force (−mg). Because the coil 202 has a core, even in a state in which a current is not applied to the coil 202, an attractive force acts.

$$Fz=Fa+Fb-mg$$

For the sake of simplicity, in FIG. 11A, the force Fb is plotted in an inversed manner.

When Fa−mg: 1101a and −Fb: 1102a are set, Fz=Fa+Fb−mg=(Fa−mg)−(−Fb) is obtained. Thus, the magnitude Fz becomes magnitude indicated by an arrow 1106a in FIG. 11A. In other words, in a section from Z=Zb to Z=Zt, a downward force is received, and in the other sections, an upward force is received.

This point will be described based on the potential energy $\Phi Z$.

Because the potential energy $\Phi Z$ of the movable element 101 is defined by an integral of a force moving the movable element 101 against a force (F) received by the movable element 101, using "∫" as an integral sign, the potential energy $\Phi Z$ is defined as $\Phi z=-\int(Fa+Fb-mg)dz+constant$.

If an appropriate constant is set, the potential energy $\Phi Z$ (1103a) becomes potential energy as illustrated in FIG. 11A, and has a minimum value at Z=Zb and has a maximum value at Z=Zt. Because an object is stabilized at a position at which potential energy becomes the minimum, the object is stabilized at Z=Zb.

At this time, if the movable range of the movable element 101 is limited to a range from 1107a to 1108a by adjusting the position of the stopper 124, even when electrical control performed by the coils 202 is stopped, the movable element 101 is stabilized at the position of Z=Zb.

Figure 12:
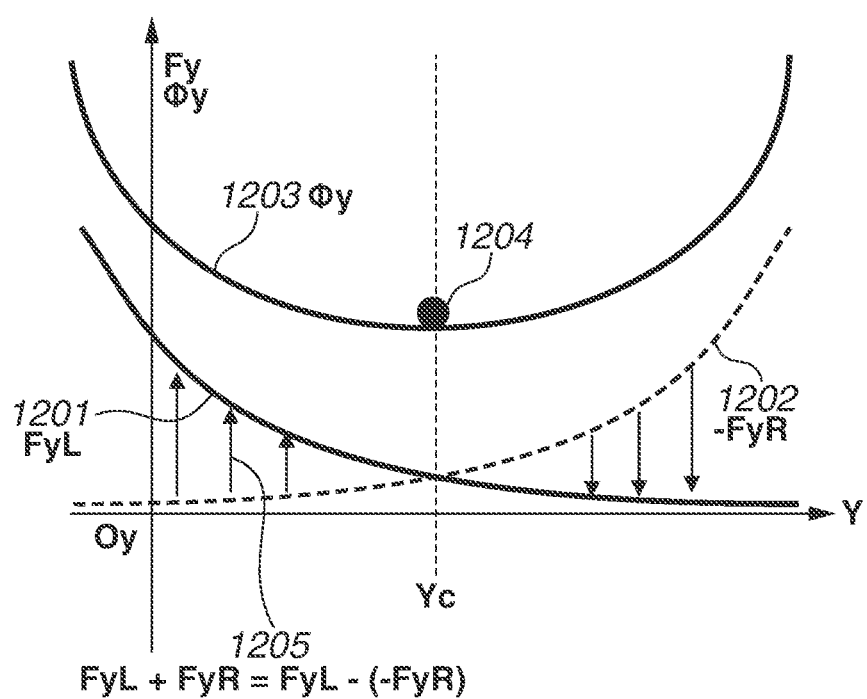
FIG. 12 is a schematic diagram illustrating the first exemplary embodiment of the present disclosure.

In a similar manner, the magnitude of a force in the Y direction that is received by the movable element 101 will be described with reference to FIG. 12.

At this time, potential energy $\Phi y$ of the movable element 101 is defined as $\Phi y=-\int(FyL+FyR)dy+constant$.

In the formula, "FyL" denotes the magnitude of a force in the Y direction that is received from the permanent magnets on the L side (permanent magnet 127L and the permanent magnet 108L), and "FyR" denotes the magnitude of a force in the Y direction that is received from the permanent magnets on the R side (permanent magnet 127R and the permanent magnet 108R).

At this time, if the force FyL (1201) is set to act in a positive direction, and the force FyR (1202) is described in an inversed manner, Φy=−∫(FyL−(−FyR))dy+constant is obtained. Thus, the potential energy Φy becomes a value obtained by integrating the magnitude of a force in an arrow 1122, and a shape as indicated by ΦY (1203) is obtained.

Because Φy (1203) becomes the minimum value at Y=Yc, similarly to the Z direction, the movable element 101 is stabilized at the position of Y=Yc.

With the above-described configuration, the movable element 101 is stabilized at the positions of Z=Zb and Y=Yc even in a state in which power is not supplied to the coils 202.

In the present exemplary embodiment, the center of the permanent magnet 127 and the center of the permanent magnet 108 can be controlled in the Y direction and stabilized by being arranged in such a manner that their positions are shifted in a direction (the Y direction) intersecting with the conveyance direction (the X direction). More specifically, by arranging the positions in the direction (the Y direction) intersecting with the conveyance direction (the X direction), with being shifted by a predetermined distance, the centers can be controlled in the Y direction and stabilized. Nevertheless, the configuration is not limited to the foregoing. For example, the positions can be stabilized by additionally installing permanent magnets in the Y direction so that the permanent magnets repel each other.

In the present exemplary embodiment, as illustrated in FIG. 11A, a position (Zt) at which the potential energy ΦZ becomes the maximum value and a position (Zb) at which the potential energy ΦZ becomes the minimum value are in a relationship of Zb<Zt. In this case, the movable element 101 is present at a position farther from the coils 202 than a position at which Fz−mg=0 is obtained when the permanent magnets (permanent magnets 127 and 108) for repulsion are not provided, that is, a position (Z0) at which an attractive force acting between the coils 202 and the permanent magnets 103 and a gravitational force of the movable element 101 balance out.

With this configuration, because a constant of a thrust force acting between the coils 202 and the permanent magnets 103 becomes smaller than that at the position Z=Z0, a current flowing when the movable element 101 is conveyed sometimes becomes larger than that at the position Z=Z0, by that amount.

Figure 4:
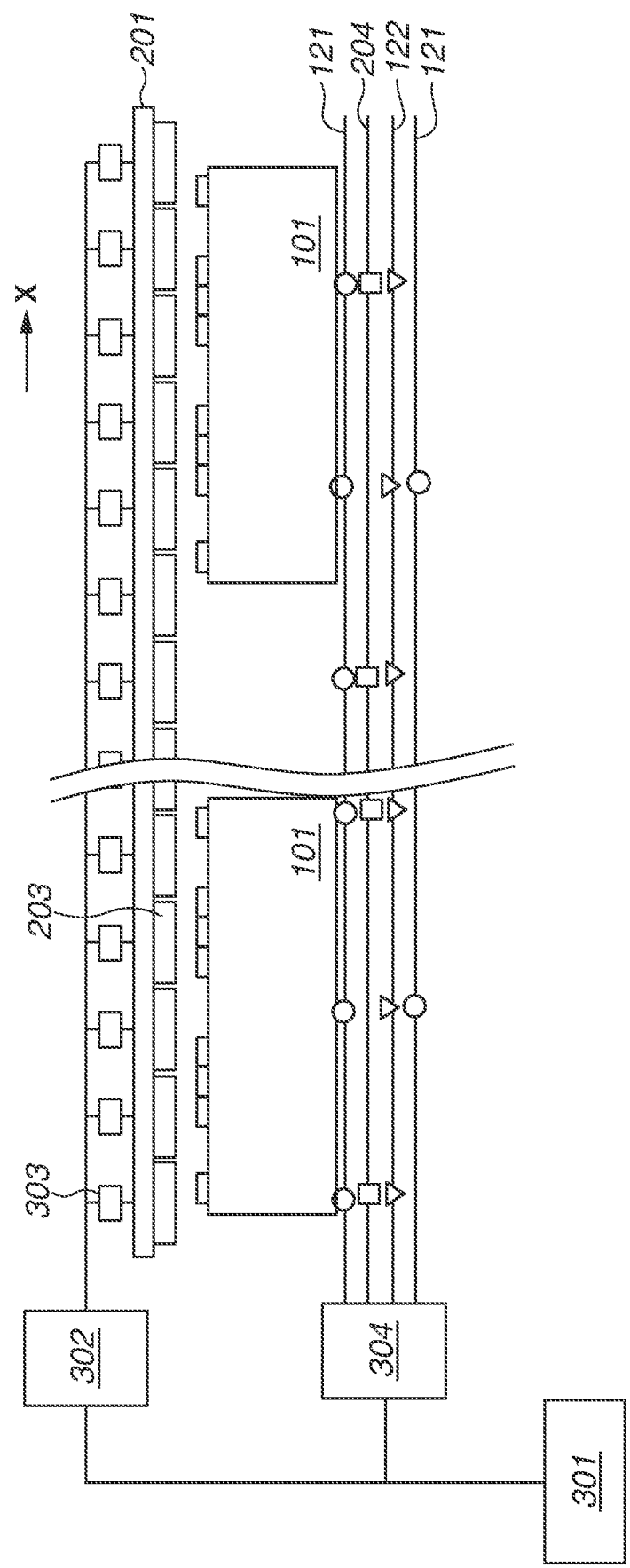
FIG. 4 is a schematic diagram illustrating the first exemplary embodiment of the present disclosure.

Next, a control system that controls the conveyance apparatus 1 according to the present exemplary embodiment will be further described with reference to FIG. 4. FIG. 4 is a schematic diagram illustrating the control system that controls the conveyance apparatus 1 according to the present exemplary embodiment.

As illustrated in FIG. 4, the control system includes an integration controller 301, a coil controller 302, and a sensor controller 304, and functions as a control apparatus that controls the conveyance apparatus 1 including the movable element 101 and the stator 201. The coil controller 302 is connected to the integration controller 301 in such a manner that communication can be performed. The sensor controller 304 is also connected to the integration controller 301 in such a manner that communication can be performed.

A plurality of current controllers 303 is connected to the coil controller 302 in such a manner that communication can be performed. The coil controller 302 and the plurality of current controllers 303 connected to the coil controller 302 are provided to correspond to each row of the coils 202 (refer to FIG. 1) in two rows. The coil unit 203 including a plurality of coils 202 (refer to FIG. 1) is connected to each of the current controllers 303. The current controller 303 can control the magnitude of a current flowing in each of the coils 202 in the connected coil unit 203.

The coil controller 302 issues a target current command value to each of the connected current controllers 303. The current controller 303 controls a current amount of the connected coils 202.

The coils 202 are attached to both sides of the top surface of the movable element 101 that extends in the X direction in which the movable element 101 is conveyed.

The plurality of linear encoders 204, the plurality of Y sensors 122, and the plurality of Z sensors 121 are connected to the sensor controller 304 in such a manner that communication can be performed.

The plurality of linear encoders 204 is attached to the stator 201 at such an interval that one of the plurality of linear encoders 204 can measure the position of one movable element 101 while the movable element 101 is being conveyed. Further, the plurality of Y sensors 122 is attached to the stator 201 at such an interval that two of the plurality of Y sensors 122 can measure the Y target 110 of one movable element 101. Furthermore, the plurality of Z sensor 121 is attached to the stator 201 at such an interval that three of them in the two rows can measure the Z target 109 of one movable element 101.

The integration controller 301 determines a current command value of a current to be applied to the plurality of the coils 202, based on outputs from the linear encoders 204, the Y sensors 122, and the Z sensors 121, and transmits the current command value to the coil controller 302. Based on the current command value from the integration controller 301, the coil controller 302 issues a current command value to the current controller 303 as described above. The integration controller 301 thereby functions as a control apparatus, and conveys the movable element 101 along the stator 201 in a contactless manner and controls the orientation of the conveyed movable element 101 along six axes.

Figure 5:
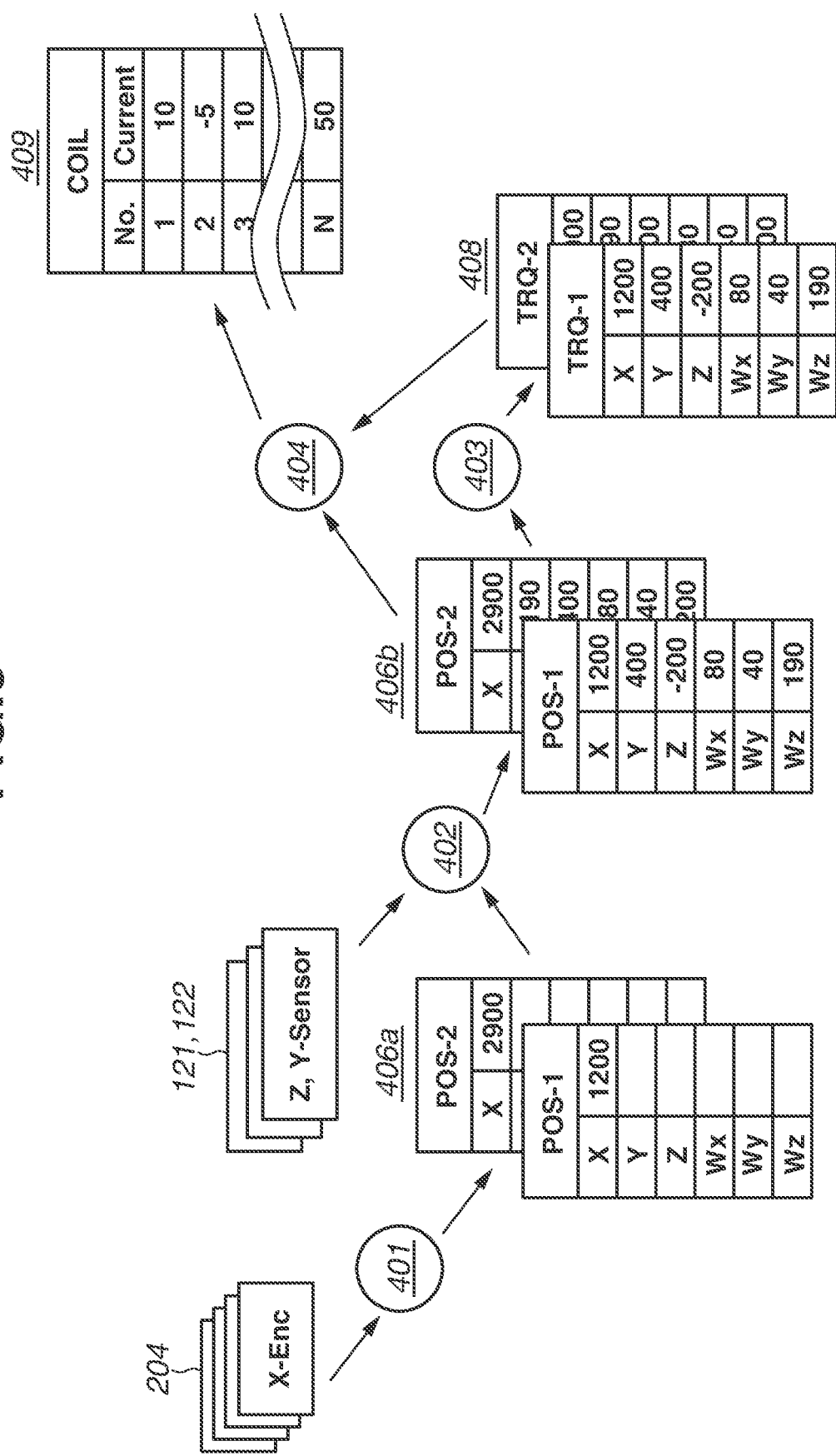
FIG. 5 is a schematic diagram illustrating the first exemplary embodiment of the present disclosure.

Hereinafter, a method of controlling an orientation of the movable element 101 that is to be executed by the integration controller 301 will be described with reference to FIG. 5. FIG. 5 is a schematic diagram illustrating an orientation control method of controlling the orientation of the movable element 101 of the conveyance apparatus 1 according to the present exemplary embodiment. FIG. 5 schematically illustrates the orientation control method of the movable element 101 while mainly focusing on a flow of data. As described below, the integration controller 301 (refer to FIG. 4) executes processing using a movable element position calculation function 401, a movable element orientation calculation function 402, a movable element orientation control function 403, and a coil current calculation function 404. The integration controller 301 thereby controls the conveyance of the movable element 101 while controlling the orientation of the movable element 101 along six axes. In place of the integration controller 301, the coil controller 302 can be configured to execute processing similar to the processing executed by the integration controller 301.

First of all, the movable element position calculation function 401 calculates the number of movable elements 101 existing on the stator 201 forming the conveyance path and the positions of the movable elements 101, based on measured values from the plurality of linear encoder 204 and information regarding the attachment positions of the plurality of linear encoder 204. The movable element position calculation function 401 thereby updates information about the movable element 101, specifically movable element position information (X) and number information of movable element information 406. The movable element position information (X) indicates the position in the X direction, i.e., the conveyance direction, of the movable element 101 on the stator 201. The movable element information 406 is prepared for each movable element 101 on the stator 201 as indicated by POS-1, POS-2, and so on in FIG. 5, for example.

Subsequently, the movable element orientation calculation function 402 identifies the Y sensor 122 and the Z sensor 121 that can measure each movable element 101, based on the movable element position information (X) of the movable element information 406 that has been updated by the movable element position calculation function 401. Subsequently, the movable element orientation calculation function 402 updates the movable element information 406 by calculating orientation information (Y, Z, Wx, Wy, Wz) that is information regarding the orientation of each movable element 101, based on values output from the identified Y sensor 122 and Z sensor 121. The movable element information 406 updated by the movable element orientation calculation function 402 includes the movable element position information (X) and the orientation information (Y, Z, Wx, Wy, Wz).

Subsequently, the movable element orientation control function 403 calculates applied force information 408 of each movable element 101 based on the present movable element information 406 including the movable element position information (X) and the orientation information (Y, Z, Wx, Wy, Wz), and a target orientation value. The applied force information 408 is information regarding the magnitude of a force to be applied to each movable element 101. The applied force information 408 includes information regarding triaxial components (Tx, Ty, Tz) of a force T to be applied, and triaxial components (Twx, Twy, Twz) of torque of the force T, which will be described below. The applied force information 408 is prepared for each movable element 101 on the stator 201 as indicated by TRQ-1, TRQ-2, and so on in FIG. 5, for example.

Subsequently, the coil current calculation function 404 determines a current command value 409 of a current to be applied to each of the coils 202, based on the applied force information 408 and the movable element information 406.

In this manner, the integration controller 301 determines the current command value 409 by executing processing using the movable element position calculation function 401, the movable element orientation calculation function 402, the movable element orientation control function 403, and the coil current calculation function 404. The integration controller 301 transmits the determined current command value 409 to the coil controller 302.

Processing performed based on the movable element position calculation function 401 will now be described with reference to FIG. 6. FIG. 6 is a schematic diagram illustrating processing performed based on the movable element position calculation function 401.

In FIG. 6, a first reference point Oe is a position reference of the stator 201 to which the linear encoder 204 is attached. In addition, a second reference point Os is a position reference of the linear scale 111 attached to the movable element 101. FIG. 6 illustrates a case where two movable elements 101, i.e., movable elements 101a and 101b, are conveyed, and three linear encoders 204, i.e., linear encoders 204a, 204b, and 204c, are arranged. The linear scales 111 are attached to the same positions on the movable elements 101a and 101b in the X direction.

For example, one linear encoder 204c faces the linear scale 111 of the movable element 101b illustrated in FIG. 6. The linear encoder 204c reads the linear scale 111 of the movable element 101b and outputs a distance Pc. In addition, when the first reference point Oe is set as an origin, a position on the X-axis of the linear encoder 204c is denoted by "Sc". Thus, a position Pos (101b) of the movable element 101b can be calculated by the following formula (1).

$$Pos(101b)=Sc-Pc \qquad \text{formula (1)}$$

For example, the two linear encoders 204a and 204b face the linear scale 111 of the movable element 101a illustrated in FIG. 6. The linear encoder 204a reads the linear scale 111 of the movable element 101a and outputs a distance Pa. In addition, when the first reference point Oe is set as an origin, a position on the X-axis of the linear encoder 204a is denoted by "Sa". Thus, a position Pos (101a) on the X-axis of the movable element 101a that is based on an output of the linear encoder 204a can be calculated by the following formula (2).

$$Pos(101a)=Sa+Pa \qquad \text{formula (2)}$$

In addition, the linear encoder 204b reads the linear scale 111 of the movable element 101a and outputs a distance Pb. In addition, when the first reference point Oe is set as an origin, a position on the X-axis of the linear encoder 204b is denoted by "Sb". Thus, a position Pos (101a)' on the X-axis of the movable element 101a that is based on an output of the linear encoder 204b can be calculated by the following formula (3).

$$Pos(101a)'=Sb-Pb \qquad \text{formula (3)}$$

Because the respective positions of the linear encoders 204a and 204b are preliminarily measured accurately, a difference between the two values Pos (101a) and Pos (101a)' is sufficiently small. If a difference between positions on the X-axis of the movable element 101 that are based on outputs from the two linear encoders 204 is sufficiently small in this manner, it can be determined that these two linear encoders 204 observe the linear scale 111 of the same movable element 101.

If a plurality of linear encoders 204 faces the same movable element 101, the position of the observed movable element 101 can be uniquely determined by calculating an average value of positions that are based on outputs from the plurality of linear encoders 204.

In the above-described manner, the movable element position calculation function 401 calculates and determines a position X in the X direction of the movable element 101, as movable element position information, based on outputs from the linear encoders 204.

Next, processing performed based on the movable element orientation calculation function 402 will be described with reference to FIGS. 7, 8A, and 8B.

FIG. 7 illustrates a case where a movable element 101c, as the movable element 101, is conveyed, and Y sensors 122a and 122b are arranged as the Y sensors 122. The two Y sensors 122a and 122b face the Y target 110 of the movable element 101c illustrated in FIG. 7. When relative distance values output by the two Y sensors 122a and 122b are respectively denoted by "Ya" and "Yb", and an interval between the Y sensors 122a and 122b is denoted by "Ly", a rotation amount Wz around the Z-axis of the movable element 101c is calculated by the following formula (4).

$$Wz=(Ya-Yb)/Ly \qquad \text{formula (4)}$$

Depending on the position of the movable element 101, three or more Y sensors 122 can face the Y target 110 in some cases. In such cases, the inclination of the Y target 110, that is, the rotation amount Wz around the Z-axis can be calculated using a least-square method.

In addition, FIGS. 8A and 8B illustrate a case where a movable element 101d, as the movable element 101, is being conveyed, and Z sensors 121a, 121b, and 121c are arranged as the Z sensors 121. The three Z sensors 121a, 121b, and 121c face the Z target 109 of the movable element 101d illustrated in FIGS. 8A and 8B. Relative distance values output by the three Z sensors 121a, 121b, and 121c are respectively denoted by "Za", "Zb", and "Zc". In addition, a distance in the X direction between sensors, that is, a distance between the Z sensors 121a and 121b is denoted by "Lz1". In addition, a distance in the Y direction between sensors, that is, a distance between the Z sensors 121a and 121c is denoted by "Lz2". At this time, a rotation amount Wy around the Y-axis and a rotation amount Wx around the X-axis can be respectively calculated by the following formulae (5a) and (5b).

$$Wy=(Zb-Za)/Lz1 \quad \text{formula (5a)}$$

$$Wx=(Zc-Za)/Lz2 \quad \text{formula (5b)}$$

In the above-described manner, the movable element orientation calculation function 402 can calculate the rotation amounts Wx, Wy, and Wz around the respective axes as orientation information of the movable element 101.

In addition, as described below, the movable element orientation calculation function 402 can calculate the position Y in the Y direction and the position Z in the Z direction of the movable element 101 as orientation information of the movable element 101.

First of all, the calculation of the position Y in the Y direction of the movable element 101 will be described with reference to FIG. 7. In FIG. 7, the two Y sensors 122 facing the movable element 101c are the Y sensors 122a and 122b. In addition, measured values of the Y sensor 122a and 122b are respectively denoted by "Ya" and "Yb". In addition, a midpoint between the position of the Y sensor 122a and the position of the Y sensor 122b is denoted by "Oe". Furthermore, the position of the movable element 101c that has been obtained by Formulae (1) to (3) is denoted by "Os", and a distance from the midpoint Oe' to the position Os' is denoted by "dX". At this time, the position Y in the Y direction of the movable element 101c can be calculated by approximative calculation using the following formula.

$$Y=(Ya+Yb)/2-Wz*dX'$$

Next, the calculation of the position Z in the Z direction of the movable element 101 will be described with reference to FIGS. 8A and 8B. The three Z sensors 121 facing the movable element 101d are the Z sensors 121a, 121b, and 121c. Measured values of the Z sensors 121a, 121b, and 121c are respectively denoted by "Za", "Zb", and "Zc". An X-coordinate of the Z sensor 121a and an X-coordinate of the Z sensor 121c are the same. In addition, the linear encoder 204 is assumed to be present at an intermediate position between the Z sensor 121a and the Z sensor 121c. Positions X of the Z sensor 121a and the Z sensor 121c are denoted by "Oe'". Furthermore, a distance from the position Oe' to the center Os' of the movable element 101 is denoted by "dX'". At this time, the position Z in the Z direction of the movable element 101 can be calculated by approximative calculation using the following formula.

$$Z=(Za+Zb)/2+Wy*dX'$$

If the rotation amounts Wz and Wy are large, both the position Y and position Z can be calculated with higher accuracy of approximation.

Next, processing performed by the coil current calculation function 404 will be described with reference to FIG. 1. In the following description of forces, directions in which forces in the X direction, the Y direction, and the Z direction act are respectively denoted by "x", "y", and "z". The R side, i.e., a Y+side, in FIG. 1 is denoted by "R", the L side, i.e., a Y− side, is denoted by "L", an X+side is denoted by "f", and an X− side is denoted by "b".

Figure 2A:
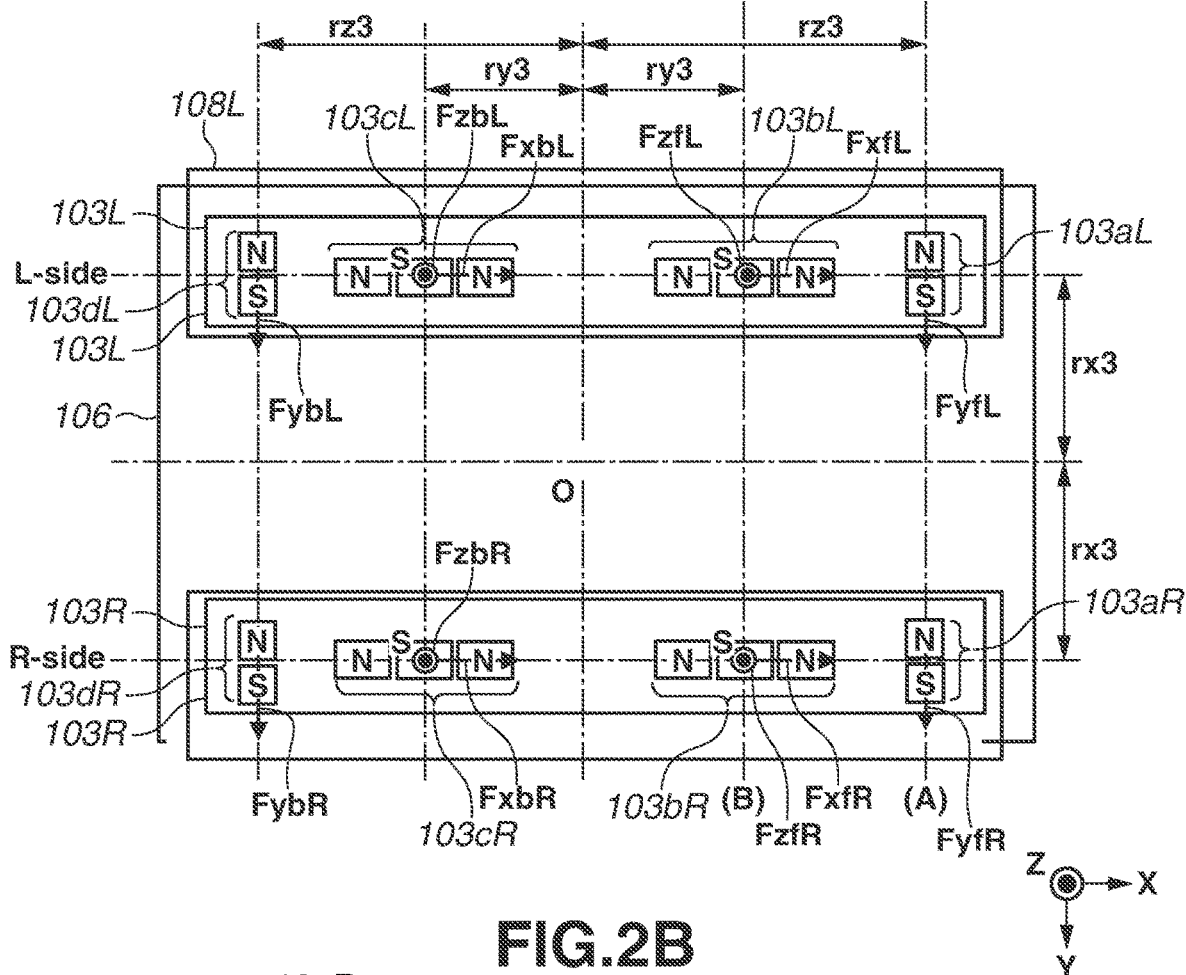
FIG. 2A is a schematic diagram illustrating the first exemplary embodiment of the present disclosure.
Figure 2B:
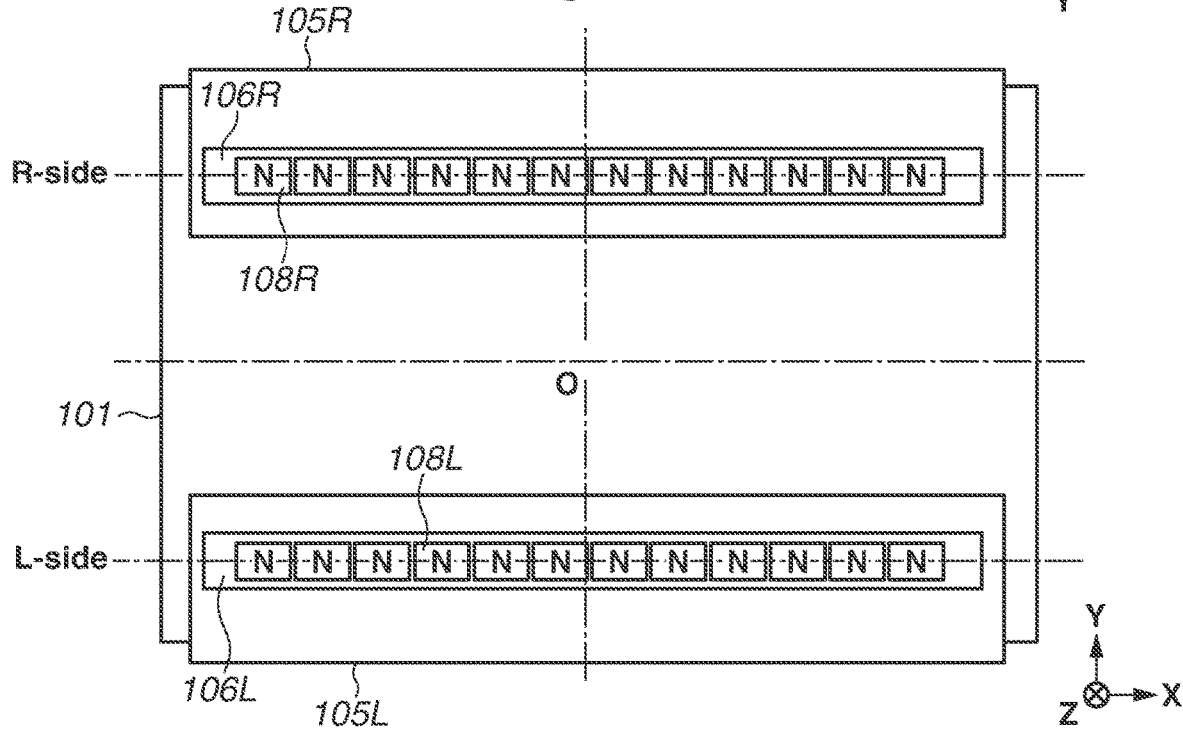
FIG. 2B is a schematic diagram illustrating the first exemplary embodiment of the present disclosure.

Forces acting on the permanent magnets 103 on the R side and the L side in FIG. 2A are described as follows. Forces acting on the permanent magnets 103 are electromagnetic forces received by the permanent magnets 103 from the plurality of coils 202 to which a current is applied. In addition to an electromagnetic force in the X direction, i.e., the conveyance direction of the movable element 101, the permanent magnets 103 receives electromagnetic forces in the Y direction and the Z direction that are directions different from the X direction, from the plurality of coils 202 to which a current is applied.

The forces acting on the permanent magnets 103 on the R side are denoted as follows.

FzfR: force acting in the Z direction on the permanent magnet 103bR on the R side FxfR: force acting in the X direction on the permanent magnet 103bR on the R side FyfR: force acting in the Y direction on the permanent magnet 103aR on the R side FxbR: force acting in the X direction on the permanent magnet 103cR on the R side FybR: force acting in the Y direction on the permanent magnet 103dR on the R side FzbR: force acting in the Z direction on the permanent magnet 103cR on the R side The forces acting on the permanent magnets 103 on the L side are denoted as follows.

FzfL: force acting in the Z direction on the permanent magnet 103bL on the L side FxfL: force acting in the X direction on the permanent magnet 103bL on the L side FyfL: force acting in the Y direction on the permanent magnet 103aL on the L side FxbL: force acting in the X direction on the permanent magnet 103cL on the L side FybL: force acting in the Y direction on the permanent magnet 103dL on the L side FzbL: force acting in the Z direction on the permanent magnet 103cL on the L side In addition, a force T to be applied to the movable element 101 is represented by the formula (6) below. In the formula, "Tx", "Ty", and "Tz" denote triaxial components of the force, and respectively denote an X direction component, a Y direction component, and a Z direction component of the force. In addition, "Twx", "Twy", and "Twz" denote triaxial components of moments, and respectively denote a component of a moment about the X-axis, a component of a moment about the Y-axis, and a component of a moment about the Z-axis. The conveyance apparatus 1 according to the present exemplary embodiment controls the conveyance of the movable element 101 while controlling the orientation of the movable element 101 along six axes by controlling the six axis components (Tx, Ty, Tz, Twx, Twy, Twz) of the force T.

$$T=(Tx,Ty,Tz,Twx,Twy,Twz) \quad \text{formula (6)}$$

Accordingly, "Tx", "Ty", "Tz", "Twx", "Twy", and "Twz" are respectively calculated by the following formulae (7a), (7b), (7c), (7d), (7e), and (7f).

$$Tx = FxfR + FxbR + FxfL + FxbL \qquad \text{formula (7a)}$$

$$Ty = FyfL + FyfR + FybL + FybR \qquad \text{formula (7b)}$$

$$Tz = FzbR + FzbL + FzfR + FzfL \qquad \text{formula (7c)}$$

$$Twx = \{(FzfL + FzbL) - (FzfR + FzbR)\}*rx3 \qquad \text{formula (7d)}$$

$$Twy = \{(FzfL + FzfR) - (FzbL + FzbR)\}*ry3 \qquad \text{formula (7e)}$$

$$Twz = \{-(FyfL + FyfR) + (FybL + FybR)\}*rz3 \qquad \text{formula (7f)}$$

At this time, restrictions represented by the formulae (7g), (7h), (7i), and (7j) below can be introduced to forces acting on the permanent magnets 103. By introducing these restrictions, a combination of forces acting on the permanent magnets 103 for obtaining the force T having predetermined six axis components can be uniquely determined.

$$FxfR = FxbR = FxfL = FxbL \qquad (7g)$$

$$FyfL = FyfR \qquad (7h)$$

$$FybL = FybR \qquad (7i)$$

$$FzbR = FzbL \qquad (7j)$$

Next, the description will be given of a method by which the coil current calculation function 404 determines an amount of current to be applied to each of the coils 202, based on a force acting on each of the permanent magnets 103.

First of all, the description will be given of a case where a force in the Z direction is applied to the permanent magnets 103a and 103d in which polarities of the north pole and the south pole are alternately arranged in the Z direction. The coils 202 are arranged in such a manner that the center in the Z direction thereof is positioned at the center in the Y direction of the permanent magnets 103a and 103d. With this configuration, forces acting in the X direction and the Y direction are hardly generated in the permanent magnets 103a and 103d.

The position of the movable element 101 is denoted by "X". When a number of a coil 202 arranged in a row is denoted by "j", the magnitude of a force acting in the Z direction on the coil 202 (j) per unit current is denoted by "Fz (j, X)", and a current applied to the coil 202 (j) is denoted by "i(j)". At this time, the coil 202 (j) is a j-th coil 202. In this case, the current i(j) can be determined in such a manner as to satisfy the formula (8) below. The formula (8) is a formula related to the permanent magnet 103dR. As for the other permanent magnets 103aR, 103aL, and 103dL, a current to be applied to the coil 202 can be similarly determined.

Figure 9A:
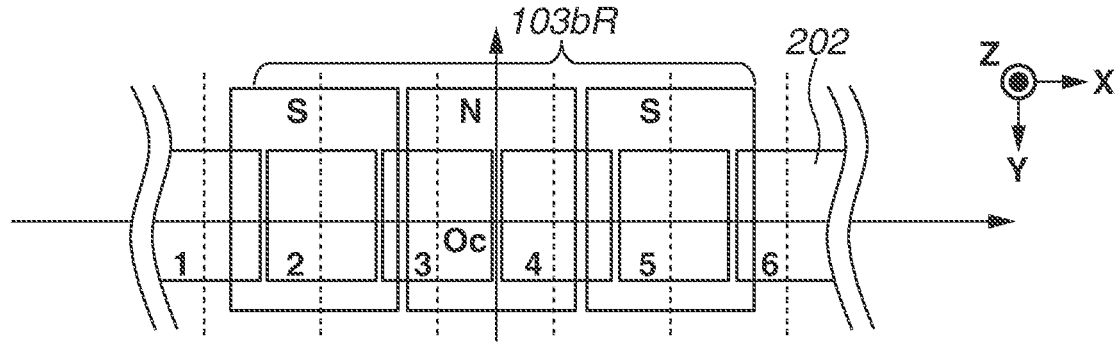
FIG. 9A is a schematic diagram illustrating the first exemplary embodiment of the present disclosure.
Figure 9B:
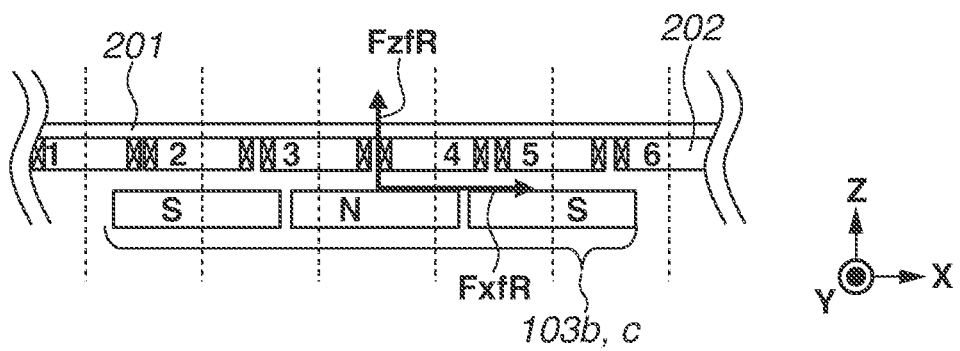
FIG. 9B is a schematic diagram illustrating the first exemplary embodiment of the present disclosure.
Figure 9C:
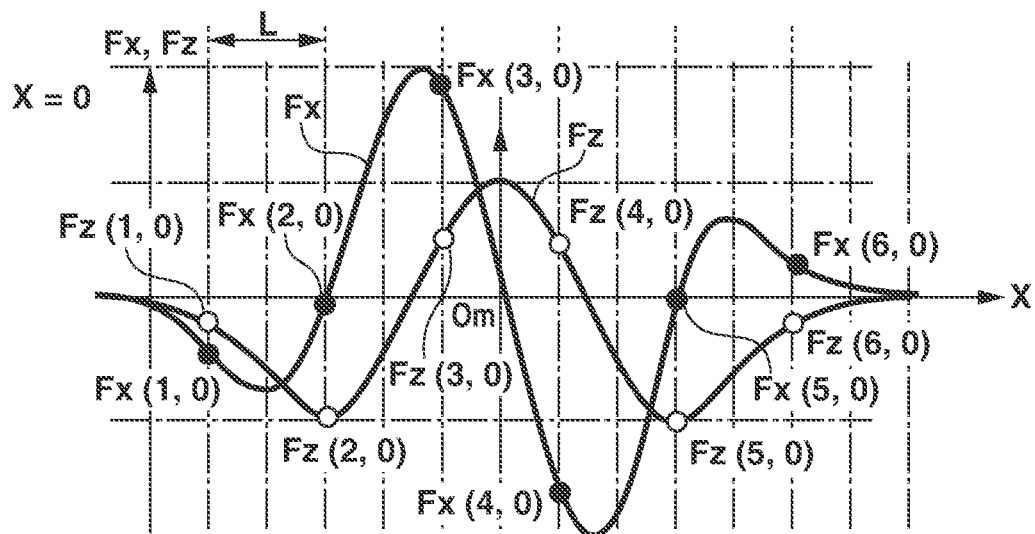
FIG. 9C is a schematic diagram illustrating the first exemplary embodiment of the present disclosure.

The linearity of a current to be applied to each of the coils 202 and a force acting on the coils 202 will be described. In FIGS. 9A to 9C, the permanent magnets 103 face the coils 202, and a large amount of magnetic fluxes output from the permanent magnets 103 passes through the inside of the coils 202 and return to the permanent magnets 103 again.

If a magnetomotive force of the permanent magnets 103 is 900 kA/m and a thickness is 0.01 m, the magnetomotive force of the permanent magnet can be expressed as 900 kA/m*0.01 m=9000 A.

On the other hand, a magnetomotive force obtainable when the number of windings of the coil 202 is 900 and a current of 1 A is applied can be expressed as 900*1 A=900 A. Thus, a magnetomotive force generated by the permanent magnets 103 is sufficiently large. In such a case, a relationship between an amount of current to be applied to the coils 202 and a newly-generated force is sufficiently linear. Thus, the following formula is satisfied.

$$\Sigma Fz(j, X)*i(j) = FzbR \qquad \text{formula (8)}$$

In the above-described manner, the coil current calculation function 404 can determine a command value of a current to be applied to the coil 202 (j). By a force in the Z direction that is applied to the movable element 101 based on the current command value determined in the above-described manner, the movable element 101 obtains a levitation force for levitating in the Z direction, and the orientation thereof is controlled.

If the plurality of coils 202 exerts a force on the permanent magnets 103, a force acting on the permanent magnets 103 can be uniquely determined by dividing a current by the magnitude of a force per unit current in accordance with a force exerted by each of the coils 202.

In addition, as illustrated in FIG. 1, the permanent magnets 103 are symmetrically arranged on the L side and the R side of the movable element 101. With such symmetrical arrangement of the permanent magnets 103, a multicomponent force acting on the permanent magnets 103, for example a force of the rotation Wx that acts on the permanent magnets 103a and 103d, that is, a moment component about the X-axis, can be canceled out by forces on the L side and the R side. It consequently becomes possible to control the orientation of the movable element 101 more accurately.

Next, the description will be given of a method of independently applying forces in the X direction and the Y direction to the permanent magnets 103b in which polarities of the north pole, the south pole, and the north pole are alternately arranged in the X direction. FIGS. 9A to 9C are schematic diagrams illustrating a method of independently applying forces in the X direction and the Y direction to the permanent magnets 103b. In accordance with the following procedure, the coil current calculation function 404 determines a current command value of a current to be applied to the coils 202 such that forces are independently applied in the X direction and the Y direction to the permanent magnets 103b. Forces in the X direction and the Y direction can also be independently applied to the permanent magnets 103c similarly to the permanent magnets 103b.

When the position of the movable element 101 is denoted by "X" and a number of a coil 202 arranged in a row is denoted by "j", the magnitudes of forces acting in the X direction and the Y direction on the coil 202 (j) per unit current are respectively expressed as "Fx (j, X)" and "Fy (j, X)". In addition, the magnitude of a current of the coil 202 (j) is expressed as "i(j)". The coil 202 (j) is a j-th coil 202.

FIG. 9A is a diagram illustrating a state where six coils 202 in the row of coils 202 are facing the permanent magnets 103bR. In FIG. 9A, the horizontal direction corresponds to the X-axis, and the vertical direction corresponds to the Y-axis. FIG. 9B is a diagram illustrating the state illustrated in FIG. 9A viewed from the Y direction. Numbers j from 1 to 6 are allocated to the coils 202 in the order of arrangement in the X direction. In the following description, each of the coils 202 is identified by denoting a corresponding coil 202 as a coil 202 (1), for example.

As illustrated in FIGS. 9A and 9B, the coils 202 are arranged at intervals of a distance L. On the other hand, the permanent magnets 103 of the movable element 101 are arranged at intervals of a distance 3/2*L.

The graph in FIG. 9C is a graph schematically illustrating the magnitudes of a force Fx in the X direction and a force Fz in the Z direction that are generated when a unit current is applied to the coils 202 illustrated in FIGS. 9A and 9B.

For the sake of simplicity, in FIGS. 9A, 9B, and 9C, an origin Oc of the positions in the X direction of the coils 202 corresponds to an intermediate point between the coil 202 (3) and the coil 202 (4), and a center Om in the X direction of the permanent magnets 103$b$R is set as an origin. Thus, FIGS. 9A, 9B, and 9C illustrate a case where the origin Oc and the center Om match, that is, the case of X=0.

At this time, for example, the magnitude of a force acting on the coil 202 (4) per unit current is Fx (4, 0) in the X direction and Fz (4, 0) in the Z direction. In addition, the magnitude of a force acting on the coil 202 (5) per unit current is Fx (5, 0) in the X direction and Fz (5, 0) in the Z direction.

Current values of currents to be applied to the coils 202 (1) to 202 (6) are respectively denoted by "i(1)" to "i(6)". At this time, generally, a magnitude FxfR of a force acting in the X direction on the permanent magnets 103$b$R and a magnitude FzfR of a force acting in the Y direction on the permanent magnets 103$b$R are respectively represented by the following formulae (9) and (10).

$$FxfR=Fx(1,X)*i(1)+Fx(2,X)*i(2)+Fx(3,X)*i(3)+Fx(4,X)*i(4)+Fx(5,X)*i(5)+Fx(6,X)*i(6) \quad \text{formula (9)}$$

$$FzfR=Fz(1,X)*i(1)+Fz(2,X)*i(2)+Fz(3,X)*i(3)+Fz(4,X)*i(4)+Fz(5,X)*i(5)+Fz(6,X)*i(6) \quad \text{formula (10)}$$

By determining current command values in such a manner that currents corresponding to the current values i(1) to i(6) satisfying the above-described formulae (9) and (10) are respectively applied to the coils 202 (1) to 202 (6), forces in the X direction and the Z direction can be independently applied to the permanent magnets 103$b$R. In the above-described manner, the coil current calculation function 404 can determine current command values of currents to be applied to the coils 202 (j) such that forces in the X direction and the Z direction are independently applied to the permanent magnets 103.

For the sake of more simplicity, in the case illustrated in FIGS. 9A, 9B, and 9C, an example case of performing control in such a manner that only the coils 202 (3), 202 (4), and 202 (5) of the coils 202 (1) to 202 (6) are used for the permanent magnets 103$b$R, and furthermore, the summation of current values of these three coils becomes 0 will be considered. In this example case, a force FxfR acting in the X direction on the permanent magnets 103$b$R and a force FzfR acting in the Z direction on the permanent magnets 103$b$R are respectively represented by the following formulae (11) and (12).

$$FxfR=Fx(3,X)*i(3)+Fx(4,X)*i(4)+Fx(5,X)*i(5) \quad \text{formula (11)}$$

$$FzfR=Fz(3,X)*i(3)+Fz(4,X)*i(4)+Fz(5,X)*i(5) \quad \text{formula (12)}$$

In addition, current values of the coils 202 (1) to 202 (6) can be set to satisfy the following formulae (13) and (14).

$$i(3)+i(4)+i(5)=0 \quad \text{formula (13)}$$

$$i(1)=i(2)=i(6)=0 \quad \text{formula (14)}$$

Thus, if magnitudes of forces (FxfR, FzfR) necessary for the permanent magnets 103$b$R are determined, the current values i(1), i(2), i(3), i(4), i(5), and i(6) can be uniquely determined. Based on the current command values determined in this manner, forces in the X direction and the Z direction are applied to the movable element 101. By the force in the X direction that is applied to the movable element 101, the movable element 101 obtains a thrust force for moving in the X direction, and moves in the X direction. In addition, by the forces in the X direction and the Z direction that are applied to the movable element 101 based on the current command values determined in this manner, the orientation of the movable element 101 is controlled.

In this manner, the integration controller 301 controls each of the six axis components of a force applied to the movable element 101 by controlling currents to be applied to the plurality of coils 202.

If the center Oc of the coils 202 relatively moves with respect to the center Om of the permanent magnets 103$b$R by the conveyance of the movable element 101, that is, in the case of X≠0, the coils 202 corresponding to the moved position can be selected. Furthermore, calculation similar to the above calculation can be executed based on a force generated in the coils 202 per unit current.

In the above-described manner, by performing control after determining current command values of currents to be applied to the plurality of coils 202, the integration controller 301 controls contactless conveyance of the movable element 101 on the stator 201 while controlling the orientation of the movable element 101 on the stator 201 along six axes. In other words, the integration controller 301 functions as a conveyance control unit that controls the conveyance of the movable element 101, and controls contactless conveyance of the movable element 101 on the stator 201 by controlling an electromagnetic force to be received by the permanent magnets 103 from the plurality of coils 202. In addition, the integration controller 301 functions as an orientation control unit that controls the orientation of the movable element 101, and controls the orientation of the movable element 101 on the stator 201 along six axes. All or part of the functions of the integration controller 301 as a control apparatus can be executed by the coil controller 302 and other control apparatuses instead.

In this manner, according to the present exemplary embodiment, a six-axis force including triaxial force components (Tx, Ty, Tz) and triaxial moment components (Twx, Twy, Twz) can be applied to the movable element 101 by the plurality of coils 202 arranged in two rows. With this configuration, while controlling the orientation of the movable element 101 along six axes, the conveyance of the movable element 101 can be controlled. According to the present exemplary embodiment, using the coils 202 arranged in two rows, which are smaller in number than the number of six-axis components of a force as variables to be controlled, the conveyance of the movable element 101 can be controlled while the orientation of the movable element 101 is controlled along six axes.

Thus, according to the present exemplary embodiment, without an increase in size or complication of the system due to the configuration where the number of rows of the coils 202 can be reduced, the movable element 101 can be conveyed in a contactless manner based on the control of the orientation of the movable element 101. Furthermore, according to the present exemplary embodiment, because it is possible to reduce the number of rows of the coils 202, a compact magnetic levitation type conveyance apparatus can be formed inexpensively.

Second Exemplary Embodiment

Figure 13:
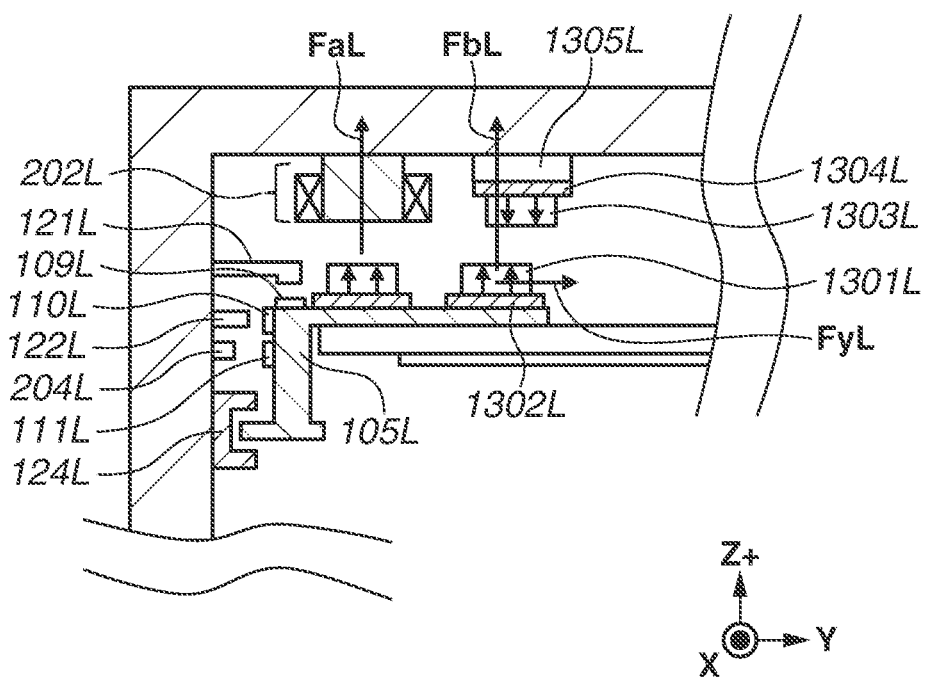
FIG. 13 is a schematic diagram illustrating the second exemplary embodiment of the present disclosure.

A second exemplary embodiment will be described with reference to FIG. 13.

In the first exemplary embodiment, the description has been given of an example in which two rows of permanent magnets 108 are arranged and attached to end portions on the L side and the R side of the bottom surface of the movable element 101 in the X direction. In contrast to this, in the present exemplary embodiment, the description will be given of an example in which a permanent magnet 1301L is attached to the top surface of the movable element 101. The illustration and description of the R side will be omitted because these are similar to those of the L side. In addition, the components with no change from those in the first exemplary embodiment are assigned the same reference numerals, and the description will be omitted. In FIG. 13, the permanent magnet 1301L is attached to the top surface of the movable element 101, and a permanent magnet 1303L is attached to the stator 201. Then, the permanent magnet 1301L on the movable element side and the permanent magnet 1303L on the stator side are magnetized in directions repelling each other. More specifically, the permanent magnet 1301L on the movable element side and the permanent magnet 1303L on the stator side repel each other. The permanent magnets 1301L and 1303L are attached respectively to yokes 1302L and 1304L, and a bracket 1305L is provided between the stator 201 and the yoke 1304L.

With this configuration, if the movable element 101 moves upward, a repulsive force is received from the permanent magnet 1303L attached to the stator 201.

The details will be further described with reference to FIG. 11B.

Figure 11B:
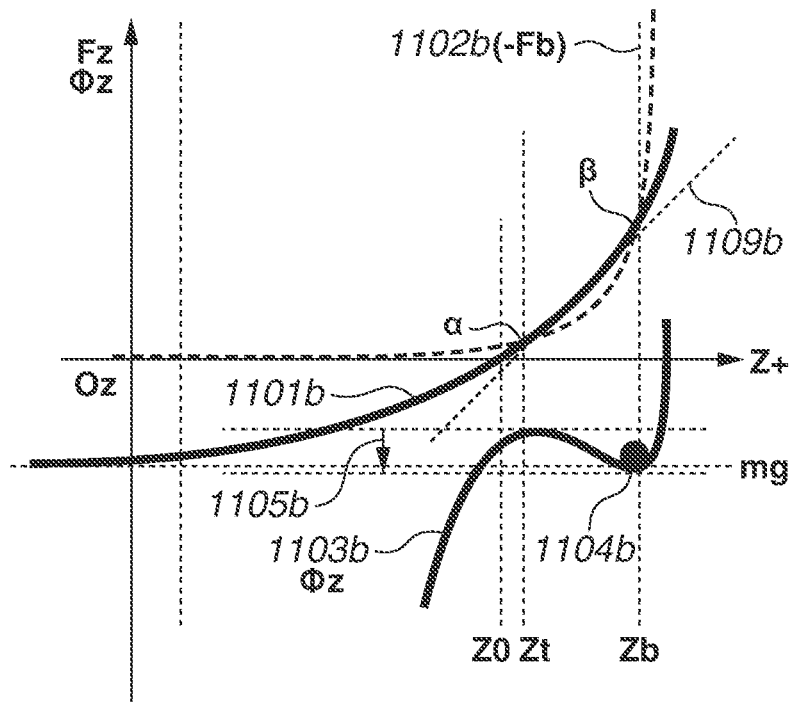
FIG. 11B is a schematic diagram illustrating a second exemplary embodiment of the present disclosure.

FIG. 11B is a diagram schematically illustrating a force received by the movable element 101, similarly to FIG. 11A.

Unlike FIG. 11A, in FIG. 11B, an absolute value of Fb becomes larger as a position in the Z direction moves towards the Z+ direction. In addition, because a repulsive force is a downward force, Fb exist in a second quadrant (Fz>0) unlike FIG. 11A.

In this case, if a relationship between the coils 202 and the permanent magnets 103 is kept unchanged, a profile of Fa-mg (1101b) remains the same as that of Fa-mg (1101a) in FIG. 11A. On the other hand, the magnitude of Fb has a larger change in the inclination (1102b) by the Fa-mg (1101b).

By providing the repelling permanent magnets (1301, 1303) as described above, as illustrated in FIG. 11B, the potential energy ΦZ has the minimum value at Z=Zb, and has the maximum value at Z=Zt. Thus, the position of the movable element 101 is stabilized near Z=Zb.

In the case of the second exemplary embodiment, because the position of the movable element 101 needs to be stabilized in a region in which the inclination of Fa-mg is larger as compared with the first exemplary embodiment, the inclination of Fb needs to be further increased. Thus, the repelling permanent magnets (1301, 1303) are more likely to be large in size as compared with the first exemplary embodiment.

In the present exemplary embodiment, however, the position of the movable element 101 is stabilized at a position closer to the coils 202 as compared with the position of Z=Z0, so that a thrust force constant becomes larger as compared with Z=Z0 or the first exemplary embodiment in some cases. Thus, the same thrust force can be generated with a small current.

On the other hand, as compared with the first exemplary embodiment, the depth (1105b) of potential energy tends to be smaller as compared with the depth (1105a) of potential energy in the first exemplary embodiment. Thus, a degree of stabilization is small.

In the case of the second exemplary embodiment, because it is possible to design the coils 202 and the repelling permanent magnets (1301, 1303) to be arranged in proximity to each other, it is possible to achieve a more compact apparatus configuration. In a case where a process apparatus for processing is the deposition source 140 (refer to FIG. 1) provided below the movable element 101, if the repelling permanent magnets (1301, 1303) exist below the movable element 101, the repelling permanent magnets (1301, 1303) can disturb the deposition source 140. Even in such a case, according to the present exemplary embodiment, it is possible to locate the permanent magnets (1301, 1303) on the opposite side of the process apparatus such as the deposition source 140 (refer to FIG. 1), which is beneficial and advantageous.

Third Exemplary Embodiment

Figure 14:
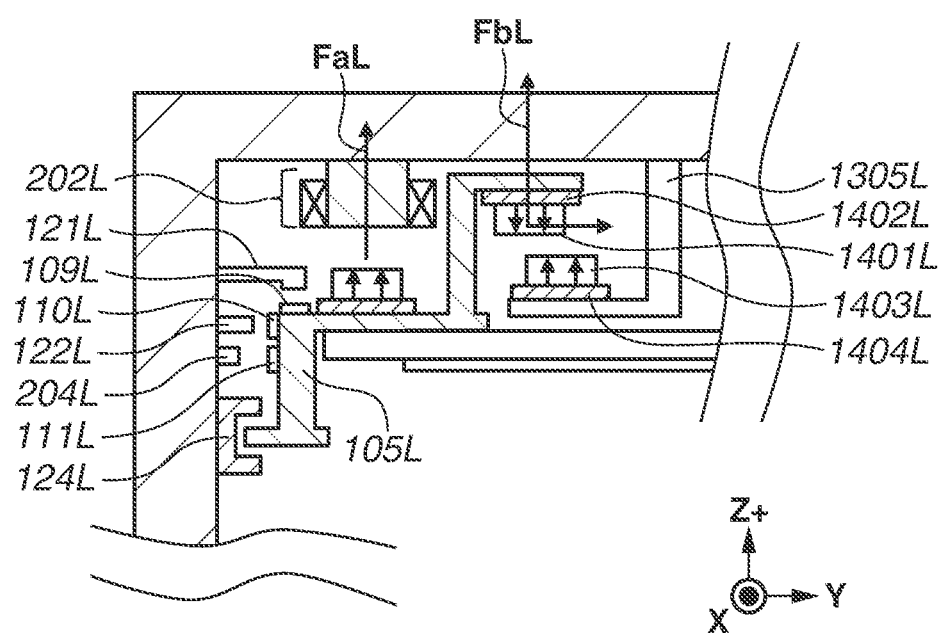
FIG. 14 is a schematic diagram illustrating a third exemplary embodiment of the present disclosure.

A third exemplary embodiment will be described with reference to FIG. 14.

In the first exemplary embodiment, the description has been given of an example in which two rows of permanent magnets 108 are arranged and attached to end portions on the L side and the R side of the bottom surface of the movable element 101 in the X direction. In addition, in the second exemplary embodiment, the description has been given of an example in which, by attaching the permanent magnet 1301L and the permanent magnet 1303L to the movable element and the stator in such a manner that the permanent magnet 1301L attached to the movable element exists on the lower side and the permanent magnet 1303L attached to the stator exists on the upper side, if the movable element moves upward, the movable element receives a repulsive force. In the present exemplary embodiment, the description will be given of an example in which, by attaching a permanent magnet 1401L and a permanent magnet 1403L to the movable element and the stator in such a manner that the permanent magnet 1401L attached to the movable element exists on the upper side and the permanent magnet 1403L attached to the stator exists on the lower side, if the movable element goes downward, the movable element receives a repulsive force. In FIG. 14, only the L side is illustrated, and the illustration and description of the R side will be omitted because these are similar to those of the L side. In addition, the components with no change from those in the first or second exemplary embodiment are assigned the same reference numerals, and the description will be omitted. In FIG. 14, the permanent magnet 1401L is attached to the movable element adapter 105 attached to the top surface of the movable element, and the permanent magnet 1403L is attached to a bracket 1405L attached to the stator 201. Then, the permanent magnet 1401L on the movable element side and the permanent magnet 1403L on the stator side are magnetized in directions repelling each other. The permanent magnets 1401L and 1403L are attached respectively to yokes 1402L and 1404L, and a bracket 1305L is provided between the stator 201 and the yoke 1404L.

With this configuration, if the movable element 101 goes downward, the movable element 101 is configured to receive a repulsive force from the permanent magnet 1403L attached to the stator 201.

The shapes of the movable element adapter 105 and the bracket 1305L of the stator become an S-shape, and upsizing easily occurs. Nevertheless, if the movable element 101 goes downward, the movable element 101 receives a repulsive force from the permanent magnet 1403L on the stator side, and thereby it is easy to make the potential Fz deep as in the first exemplary embodiment. Stabilization thus can be easily performed.

Because the definition of the potential energy ΦZ is similar to that in the first exemplary embodiment, the description will be omitted.

Fourth Exemplary Embodiment

Figure 16:
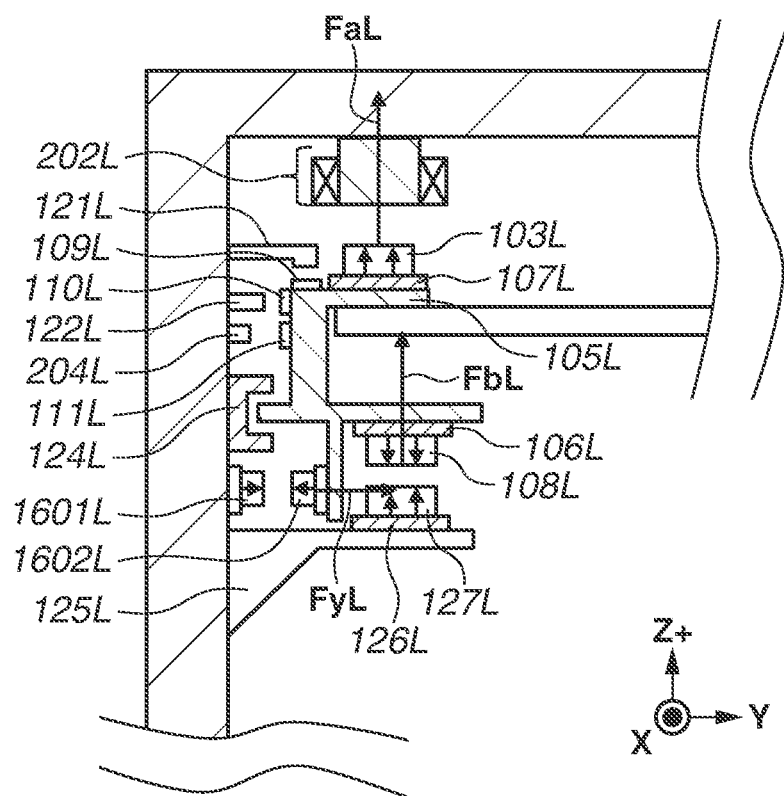
FIG. 16 is a schematic diagram illustrating a fourth exemplary embodiment of the present disclosure.

A fourth exemplary embodiment will be described with reference to FIG. 16.

In the first exemplary embodiment, the description has been given of an example in which two rows of permanent magnets 108 are arranged and attached to end portions on the L side and the R side of the bottom surface of the movable element 101 in the X direction.

In the present exemplary embodiment, the description will be given of an example in which a set of permanent magnets 1601L and 1602L is arranged in the Y direction in addition to the components in the first exemplary embodiment. In FIG. 16, only the L side is illustrated, and the illustration and description of the R side will be omitted because these are similar to those of the L side. FIG. 16 illustrates only one permanent magnet 1601L and only one permanent magnet 1602L, but a plurality of permanent magnets 1601L and a plurality of permanent magnets 1602L are arranged in the X direction. In addition, the components with no change from those in the first or second exemplary embodiment are assigned the same reference numerals, and the description will be omitted.

By arranging the set of permanent magnets 1601L and 1602L in the Y direction, the position of the movable element 101 can also be stabilized in the Y direction.

The permanent magnets 1601L and 1602L may be provided alone, or yokes may be attached to the back sides of the permanent magnets. In addition, the permanent magnets 1601L will also be referred to as a fifth magnet group. A plurality of permanent magnets included in the fifth magnet group will also be referred to as fifth magnets. The fifth magnet is not limited to a permanent magnet, and may be an electrical magnet. In addition, the permanent magnets 1602L will also be referred to as a fourth magnet group. A plurality of permanent magnets included in the fourth magnet group will also be referred to as fourth magnets. The fourth magnet is not limited to a permanent magnet, and may be an electrical magnet.

Fifth Exemplary Embodiment

A fifth exemplary embodiment will be described with reference to FIG. 17.

In the first exemplary embodiment, the description has been given of an example in which two rows of permanent magnets 108 are arranged and attached to end portions on the L side and the R side of the bottom surface of the movable element 101 in the X direction. In FIG. 1, the description has been also given of an example in which the shapes of the permanent magnets 108L and 127L are a flat plate shape.

In the present exemplary embodiment, the description will be given of an example in which permanent magnets 1701L and 1702L curved in a C-shape are arranged to face each other, in place of the permanent magnets 108L and 127L having a flat plate shape that are illustrated in FIG. 1. In FIG. 17, only the L side is illustrated, and the illustration and description of the R side will be omitted because these are similar to those of the L side. In addition, the components with no change from those in the first or second exemplary embodiment are assigned the same reference numerals, and the description will be omitted.

Figure 17:
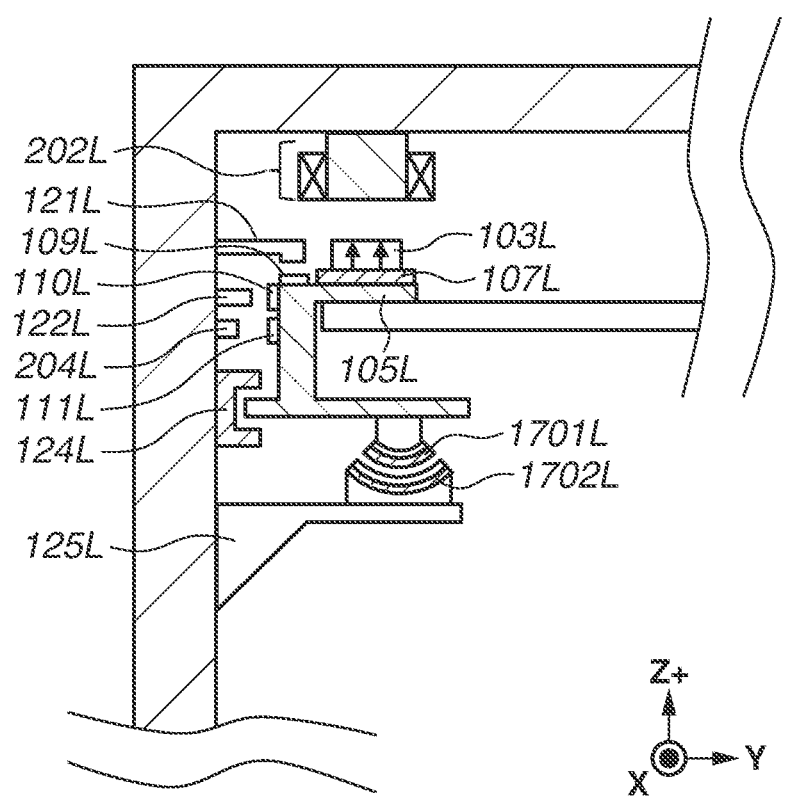
FIG. 17 is a schematic diagram illustrating a fifth exemplary embodiment of the present disclosure.

By arranging the permanent magnets 1701L and 1702L curved in a C-shape as illustrated in FIG. 17, the position of the movable element 101 can also be stabilized in the Y direction.

The permanent magnets 1701L and 1702L may be provided alone, or yokes may be attached to the back sides of the permanent magnets.

In FIG. 17, the permanent magnet 1701L and the permanent magnet 1702L have respective shapes such that the permanent magnet 1701L is surrounded by the permanent magnet 1702L, but the relationship may be reversed such that the permanent magnet 1702L is surrounded by the permanent magnet 1701L.

Sixth Exemplary Embodiment

A sixth exemplary embodiment will be described with reference to FIG. 18.

In the first exemplary embodiment, the description has been given of an example in which two rows of permanent magnets 108 are arranged and attached to end portions on the L side and the R side of the bottom surface of the movable element 101 in the X direction. In addition, the description has been given of an example in which, in FIG. 1, the shapes of the permanent magnets 108L and 127L are a flat plate shape.

In the present exemplary embodiment, the description will be given of an example in which, in place of the permanent magnets 108L having a flat panel shape that is illustrated in FIG. 1, permanent magnets 1801aL and 1802aL having a flat panel shape, and permanent magnets 1801bL and 1802bL also having a flat panel shape are arranged in a V-shape such that the permanent magnets 1801aL and 1802aL face the permanent magnets 1801aL and 1802aL. In FIG. 18, only the L side is illustrated, and the illustration and description of the R side will be omitted because these are similar to those of the L side. In addition, the components with no change from those in the first or second exemplary embodiment are assigned the same reference numerals, and the description will be omitted.

Figure 18:
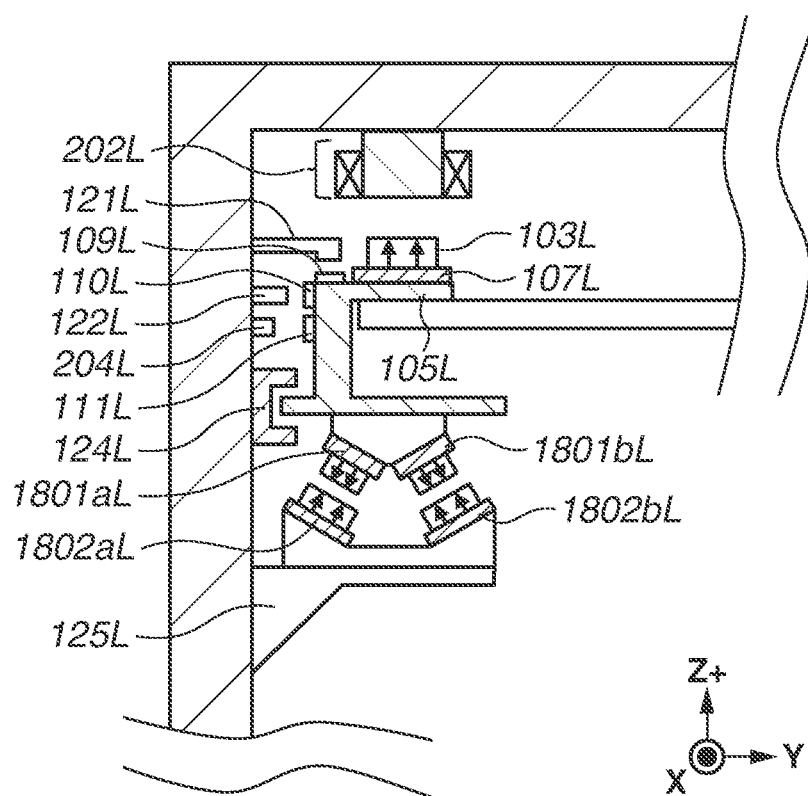
FIG. 18 is a schematic diagram illustrating a sixth exemplary embodiment of the present disclosure.

By arranging the permanent magnets 1801aL and 1802aL having a flat panel shape in a V-shape as illustrated in FIG. 18, the position of the movable element 101 can also be stabilized in the Y direction.

The permanent magnets 1801aL, 1802aL, 1801bL, and 1802bL may be provided alone, or yokes may be attached to the back sides of the permanent magnets.

In FIG. 18, the permanent magnets 1801aL and 1801bL each have a shape such that the permanent magnets 1801aL and 1801bL are surrounded by the permanent magnets 1802aL and 1802bL, but the relationship may be reversed such that the permanent magnets 1802aL and 1802bL are surrounded by the permanent magnets 1801aL and 1801bL.

Seventh Exemplary Embodiment

A seventh exemplary embodiment will be described with reference to FIG. 19.

In the first exemplary embodiment, the description has been given of an example in which two rows of permanent magnets 108 are arranged and attached to end portions on the L side and the R side of the bottom surface of the movable element 101 in the X direction. In addition, the description has been given of an example in which, in FIG. 1, the shapes of the permanent magnets 108L and 127L are a flat plate shape.

In the present exemplary embodiment, the description will be given of an example in which permanent magnets 1902aL and 1902bL arranged in two rows on the L side are placed to face the permanent magnet 108L in place of the permanent magnets 127L arranged in a row on the L side in FIG. 1. In FIG. 19, only the L side is illustrated, and the illustration and description of the R side will be omitted because these are similar to those of the L side. In addition, the components with no change from those in the first or second exemplary embodiment are assigned the same reference numerals, and the description will be omitted.

Figure 19:
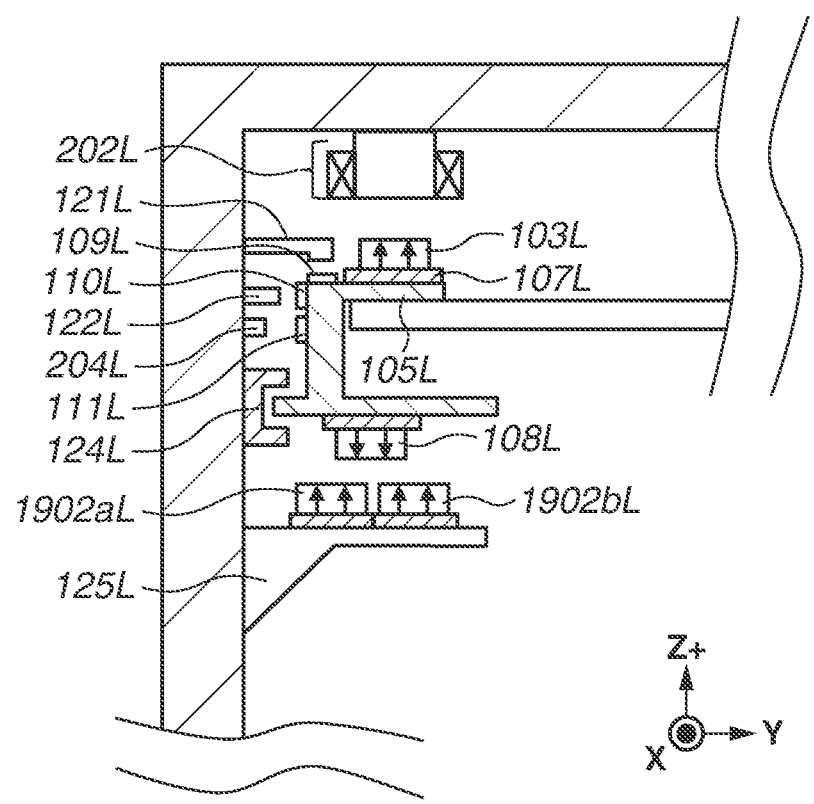
FIG. 19 is a schematic diagram illustrating a seventh exemplary embodiment of the present disclosure.

By arranging the permanent magnets 1902aL and 1902bL in two rows on the L side as illustrated in FIG. 19, the position of the movable element 101 can also be stabilized in the Y direction.

The permanent magnets 1902aL and 1902bL may be provided alone, or yokes may be attached to the back sides of the permanent magnets.

In FIG. 19, the divided permanent magnets 1902aL and 1902bL are attached on the stator side, but the arrangement relationship between the permanent magnet 108L on the movable element side and the permanent magnets 1902aL and 1902bL on the stator side may be opposite.

In the first to seventh exemplary embodiments, a combination of the coils 202 and the permanent magnets 103 is provided on the top surface side of the movable element 101, but the combination may be provided on the bottom surface side of the movable element 101. In this case, coreless coils 202 are desirably used. In a case of use of coreless coils 202, when power is not supplied to the coils 202, an attractive force between the coils 202 and the permanent magnets 103 is not exerted. Thus, the attractive force 1501 is not exerted in FIG. 15, for example.

As described above, according to an exemplary embodiment of the present disclosure, a movable element can be stably conveyed in a contactless manner.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-233231, filed Dec. 24, 2019 which is hereby incorporated by reference herein in its entirety.

What is claimed is:

1. A conveyance apparatus comprising:
   a stator in which a plurality of coils is arranged along a first direction; and
   a movable element configured to move along the plurality of coils,
   wherein the stator includes a first magnet group including a plurality of first magnets arranged along the first direction and magnetized in one direction,
   wherein the movable element includes a second magnet group including a plurality of second magnets arranged to face the plurality of coils, and a third magnet group including a plurality of third magnets arranged to face the first magnet group and magnetized in a direction repelling the first magnet group, and
   wherein a center of the first magnet group in a second direction intersecting with the first direction and a center of the third magnet group in the second direction are arranged to be shifted from each other in the second direction.

2. The conveyance apparatus according to claim 1, wherein the first magnet group and the third magnet group generate respective forces repelling each other therebetween in a direction of a gravitational force.

3. The conveyance apparatus according to claim 1, wherein the third magnet group is arranged on a bottom surface of the movable element.

4. The conveyance apparatus according to claim 1, wherein the third magnet group is arranged on a top surface of the movable element.

5. The conveyance apparatus according to claim 1, wherein the third magnet group is arranged at a position facing a top surface of the movable element.

6. A manufacturing method of an article, the manufacturing method comprising:
   manufacturing an article by processing a workpiece conveyed by the conveyance apparatus according to claim 1.

7. The conveyance apparatus according to claim 1, wherein at least one of the plurality of third magnets has a curved shape.

8. The conveyance apparatus according to claim 1, wherein at least two of the plurality of third magnets are arranged in a V-shape.

9. The conveyance apparatus according to claim 1,
   wherein the movable element further includes, on a side surface, a fourth magnet group including a plurality of fourth magnets arranged along the first direction and magnetized in one direction, and wherein the stator includes, at a position facing the fourth magnet group, a fifth magnet group including a plurality of fifth magnets magnetized in a direction repelling the fourth magnet group.

10. A conveyance apparatus comprising:

a stator; and a movable element relatively movable in a predetermined conveyance direction with respect to the stator, wherein the stator includes a plurality of coils arranged along the predetermined conveyance direction, and a first magnet group including a plurality of first magnets arranged along the predetermined conveyance direction, wherein the movable element includes:

a second magnet group facing the plurality of coils of the stator and including a plurality of second magnets for moving the movable element in the predetermined conveyance direction by a force generated between the plurality of coils of the stator and the plurality of second magnets of the movable element, and a third magnet group facing the first magnet group and including a plurality of third magnets generating a force in a direction for relatively levitating the movable element with respect to the stator, and wherein the second magnet group is arranged on a top surface side of the movable element.

11. The conveyance apparatus according to claim 10, wherein the third magnet group is arranged on a bottom surface side of the movable element, and wherein the third magnet group generates a force in a direction repelling a direction of a gravitational force between the first magnet group of the stator and the third magnet group.

12. The conveyance apparatus according to claim 10, wherein a center of the first magnet group in a second direction intersecting with the predetermined conveyance direction and a center of the third magnet group in the second direction are arranged to be shifted from each other in the second direction.

13. The conveyance apparatus according to claim 12, wherein the third magnet group is arranged in each of rows extending in a first direction such that a center of the movable element is positioned therebetween in the second direction, and wherein the first magnet group is arranged in each of rows extending in the first direction such that the center of the movable element is positioned therebetween in the second direction.

14. The conveyance apparatus according to claim 12, wherein, by arranging the center of the first magnet group in the second direction intersecting with the predetermined conveyance direction and the center of the third magnet group in the second direction to be shifted from each other in the second direction, a position of the movable element in the second direction is controlled.

15. The conveyance apparatus according to claim 10, wherein the second magnet group moves the movable element in a direction intersecting with the predetermined conveyance direction, the direction for relatively levitating the movable element, and a direction of a gravitational force, by the force generated between the plurality of coils of the stator and the plurality of second magnets of the movable element.

16. A manufacturing method of an article, the manufacturing method comprising:

manufacturing an article by processing a workpiece conveyed by the conveyance apparatus according to claim 10.

17. The conveyance apparatus according to claim 10, wherein the first magnet group and the third magnet group generate respective forces repelling each other therebetween in a direction of a gravitational force.

\* \* \* \* \*